United States Patent
Mizukoshi

(10) Patent No.: US 7,935,573 B2
(45) Date of Patent: May 3, 2011

(54) ELECTRONIC DEVICE AND METHOD FOR FABRICATING THE SAME

(75) Inventor: Masataka Mizukoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/636,697

(22) Filed: Dec. 11, 2009

(65) Prior Publication Data

US 2010/0093133 A1    Apr. 15, 2010

Related U.S. Application Data

(62) Division of application No. 11/147,451, filed on Jun. 8, 2005, now abandoned.

(30) Foreign Application Priority Data

Jan. 31, 2005    (JP) .................................. 2005-022694

(51) Int. Cl.
*H01L 21/00* (2006.01)

(52) U.S. Cl. ........ 438/109; 438/108; 438/406; 438/455; 257/E23.193; 257/678; 257/686; 257/688; 361/760; 361/761

(58) Field of Classification Search .......... 438/106–109, 438/113, 117, 118, 406, 455, 456; 257/E21.499, 257/E23.021, E23.067, E23.182, E23.193, 257/678, 686, 693, 700, 704, 778; 310/313 R, 310/340, 344, 348; 361/760, 761, 764, 765, 361/767

See application file for complete search history.

(56) References Cited

U.S. PATENT DOCUMENTS

| | | | |
|---|---|---|---|
| 5,355,580 A | | 10/1994 | Tsukada |
| 5,448,014 A | * | 9/1995 | Kong et al. .................... 174/539 |
| 5,818,105 A | | 10/1998 | Kouda |
| 6,141,845 A | | 11/2000 | Okeshi et al. |
| 6,150,748 A | * | 11/2000 | Fukiharu ................... 310/313 R |
| 6,304,308 B1 | * | 10/2001 | Saito et al. .................... 349/155 |

(Continued)

FOREIGN PATENT DOCUMENTS

JP    H04-302209    10/1992

(Continued)

OTHER PUBLICATIONS

Office Action (mailing date Sep. 18, 2007) issued by the Japanese Patent Office in connection with corresponding application No. JP 2005-022694.

(Continued)

*Primary Examiner* — Chris Chu
(74) *Attorney, Agent, or Firm* — Fujitsu Patent Center

(57) ABSTRACT

The electronic device comprises a first substrate 10 with an electric circuit element formed in a predetermined region of one primary surface, a second substrate 12 formed, opposed to said one primary surface of the first substrate 10, sealing portions 26, 40 formed between the first substrate 10 and the second substrate 12, enclosing the predetermined region of the first substrate 10, and an adhesion layer 42 formed on the side surfaces of the sealing parts 26, 40. The adhesion layer is formed on the side surfaces of the first sealing structure 26 on the side of the first substrate 10 and the second sealing structure 40 on the side of the second substrate 12, whereby when the first sealing structure 26 and the second sealing structure 40 are bonded to each other, the adhesion between the first sealing structure 26 and the second sealing structure 40 can be sufficiently ensured.

14 Claims, 23 Drawing Sheets

U.S. PATENT DOCUMENTS

| | | | |
|---|---|---|---|
| 6,405,592 B1 | 6/2002 | Murari et al. | |
| 6,441,478 B2* | 8/2002 | Park | 257/698 |
| 6,534,901 B1 | 3/2003 | Tsuzuki et al. | |
| 6,566,745 B1* | 5/2003 | Beyne et al. | 257/680 |
| 6,643,920 B2 | 11/2003 | Hori | |
| 6,831,725 B2* | 12/2004 | Niiya | 349/153 |
| 7,122,910 B2* | 10/2006 | Nagasaki | 257/788 |
| 7,154,206 B2 | 12/2006 | Shimada | |
| 7,248,133 B2 | 7/2007 | Koga et al. | |
| 7,255,823 B1* | 8/2007 | Guenther et al. | 264/263 |
| 7,368,321 B2* | 5/2008 | Tomita et al. | 438/113 |
| 2003/0094691 A1* | 5/2003 | Auch et al. | 257/704 |
| 2003/0137630 A1 | 7/2003 | Niiya | |
| 2004/0217703 A1* | 11/2004 | Wittmann et al. | 313/512 |
| 2004/0251777 A1 | 12/2004 | Yamamoto et al. | |
| 2006/0170089 A1* | 8/2006 | Mizukoshi | 257/686 |

FOREIGN PATENT DOCUMENTS

| | | |
|---|---|---|
| JP | H05-251516 | 9/1993 |
| JP | H10-079362 | 3/1998 |
| JP | H10-189819 | 7/1998 |
| JP | 2000-150557 | 5/2000 |
| JP | 3137322 | 12/2000 |
| JP | 2002-110869 | 4/2002 |
| JP | 2003-110402 | 4/2003 |
| JP | 2004-153580 | 5/2004 |
| JP | 2004-207674 | 7/2004 |
| JP | 2004-214469 | 7/2004 |

OTHER PUBLICATIONS

USPTO, Requirement for Restriction/Election, May 20, 2008, in parent U.S. Appl. No. 11/147,451 [now abandoned].

USPTO, Non-Final Rejection, Aug. 25, 2008, in parent U.S. Appl. No. 11/147,451 [now abandoned].

USPTO, Final Rejection, Apr. 20, 2009, in parent U.S. Appl. No. 11/147,451 [now abandoned].

USPTO, Non-Final Rejection, Aug. 26, 2009, in parent U.S. Appl. No. 11/147,451 [now abandoned].

USPTO, Abandonment, Jul. 9, 2010, in parent U.S. Appl. No. 11/147,451 [now abandoned].

* cited by examiner

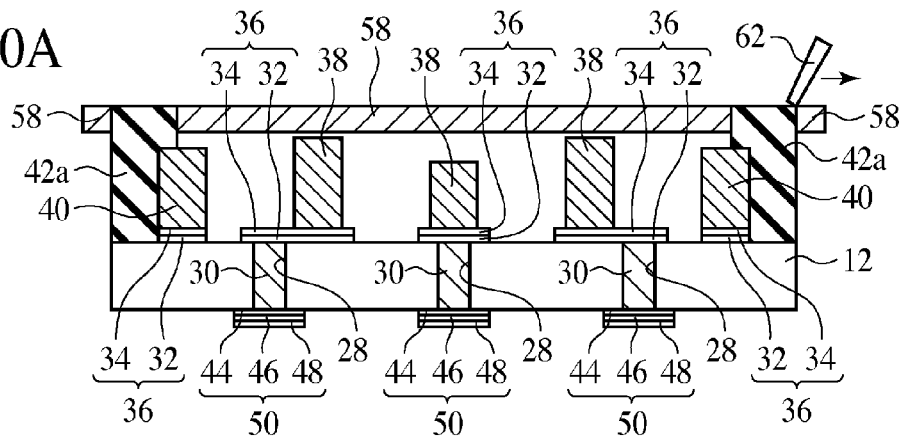
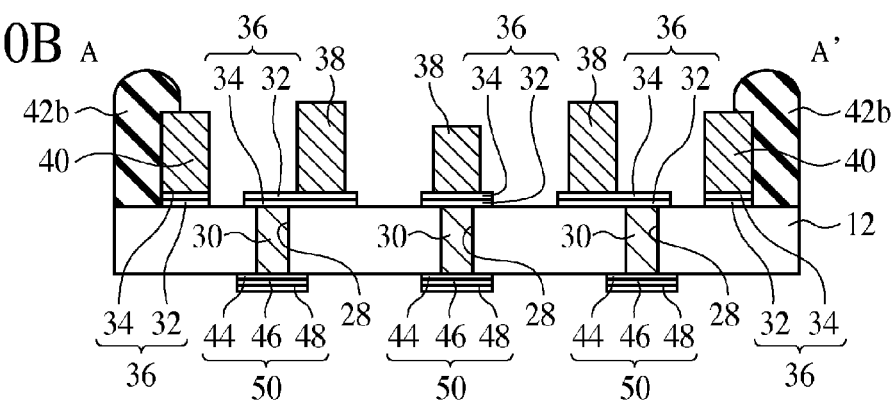
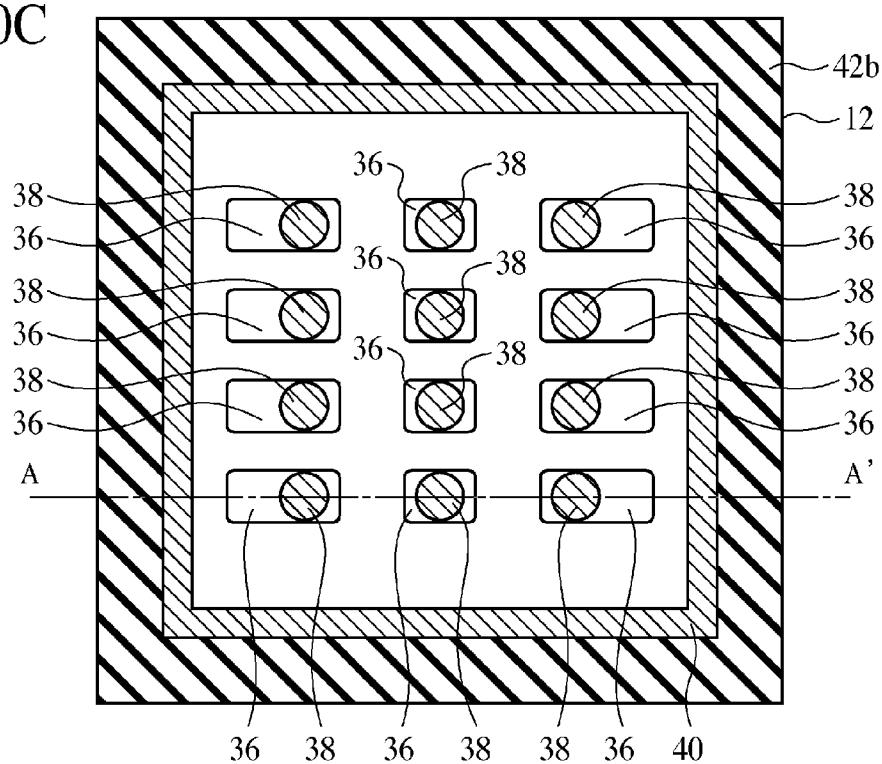

ELECTRONIC DEVICE AND METHOD FOR FABRICATING THE SAME

CROSS-REFERENCE TO RELATED APPLICATION

This application is based upon and claims priority of Japanese Patent Application No. 2005-22694, filed on Jan. 31, 2005, the contents being incorporated herein by reference.

BACKGROUND OF THE INVENTION

The present invention relates to an electronic device and a method for fabricating the electronic device, more specifically, an electronic device having electronic circuit elements hermetic sealed and a method for fabricating the electronic device.

As electronic circuit elements are increasingly highly integrated by the progress of the recent micronization technology, drastic increase of the processing speed and the cost reduction have been realized.

Semiconductor devices for industrial apparatuses, and cars are considered to be used in severe environments, as of high temperature, high humidity, etc. The semiconductor chips must be sealed in a package having high sealing performance.

SAW (Surface Acoustic Wave) devices used as the radio-frequency of portable telephones, etc. must be sealed hermetically so as to protect the comb electrode pairs.

As a method for sealing semiconductor chips, etc. in a package so as to shut the semiconductor chips, etc. off from the outside atmosphere, a method for mounting the semiconductor chips, etc. in a package to seal the semiconductor chips hermetically with a metal cover of stainless or others placed on the package is known. The cover is secured to the package with the semiconductor chips, etc. mounted on with soldering, welding or others. Outside connection terminals led out of the inside of the package are provided on the package, and the signal lines, etc. of the semiconductor chips, etc. mounted on the package are connected to the outside connection terminal with bonding wires, etc.

Semiconductor chips, etc. with electronic circuit elements formed on are sealed in a package having high sealing performance, whereby an electronic device which can stand severe environmental conditions can be provided.

[Patent Reference 1]
Specification of Japanese Patent Application Unexamined Publication No. 2004-214469

[Patent Reference 2]
Specification of Japanese Patent Application Unexamined Publication No. Hei 10-189819

[Patent Reference 3]
Specification of Japanese Patent Application Unexamined Publication No. 2003-110402

[Patent Reference 4]
Specification of Japanese Patent Application Unexamined Publication No. 2002-110869

However, in the conventional methods, the metal cover, the package of ceramics or others are expensive, which increases the cost. The cover and the package itself are relatively large, which might be a barrier to smaller-sizing the electronic device.

Furthermore, the above-described patent references have the following problem.

Patent Reference 1 discloses the technique that the electrodes on electronic circuit element (SAW chip) and electrodes on a package substrate are bonded with metal, and the outer peripheries of the device formed regions are bonded with an intermetallic compound, whereby the comb electrodes of the SAW chips are shut off from the outside so as to protect the device formed regions including the comb electrodes. However, this structure has a problem that stresses are applied to the SAW chips due to high bonding temperatures of the intermetallic compound.

Patent Reference 2 discloses the technique that when integrated circuit chips are mounted on an insulation substrate by flip chip method, barrier bumps are provided at the outer peripheries of conducting bumps, whereby the circuit formed surfaces and the electrodes, etc. of the chips are shut off from the outside for protection. However, this structure has a problem that the barrier bumps (of solder, gold or others) are melted to be bonded, and the integrated circuit chips are susceptible to stresses of the thermal expansion coefficient. The barrier bumps are melted, and might flow out. It is difficult to control the thickness of the barrier bumps.

Patent Reference 3 discloses the technique of the surface acoustic wave device that surface acoustic wave chip is flip flop bonded to a package substrate, and then the surface acoustic wave chips are covered with a glass material of low melting point to thereby seal the interior hermetically. However, this structure has a problem that the inside chips are exposed to the high glass melting temperatures and are damaged. It is also a problem that to ensure sufficient seal strength, a thickness which is several times a thickness required for the sealing with a metal cover or others is required.

Patent Reference 4 discloses the technique that semiconductor chips mounted by flip chip bonding are hermetic sealed by using a resin plate and a metal bellows spring. This technique has a problem that the structure is complicated, and the material of the metal spring, etc. is expensive.

SUMMARY OF THE INVENTION

An object of the present invention is to provide an electronic device which can seal electronic circuit elements with high sealing performance without much cost increase and larger-sizing, and a method for fabricating the electronic device.

According to one aspect of the present invention, there is provided a electronic device comprising: a first substrate with an electronic circuit element formed in a predetermined region of one primary surface; a second substrate opposed to said one primary surface of the first substrate; a sealing part formed between the first substrate and the second substrate, enclosing the predetermined region of the first substrate; and an adhesion layer formed on the side surface of the sealing part.

According to another aspect of the present invention, there is provided a method for fabricating an electronic device comprising the steps of: forming a first sealing structure on one primary surface of a first substrate, enclosing a predetermined region of said one primary surface of the first substrate, where an electronic circuit element is formed; cutting the upper portion of the first sealing structure with a cutting tool; forming a second sealing structure on a second substrate, corresponding to the first sealing structure; cutting the upper portion of the second sealing structure with a cutting tool; forming a semi-cured adhesion layer on the side surface of one of the first sealing structure and the second sealing structure; causing the first sealing structure and the second sealing structure adhered with each other, and performing thermal processing with said one of the first sealing structure and the second sealing structure positioned upper of the other of the first sealing structure and the second sealing structure so as to melt the adhesion layer and cause the adhesion layer to arrive at the side surface of said other of the first sealing structure and the second sealing structure; and performing thermal processing after the adhesion layer has been cured to bond the first sealing structure and the second sealing structure by solid phase diffusion bonding.

According to further another aspect of the present invention, there is provided a method for fabricating an electronic device comprising the steps of: forming a first sealing structure on one primary surface of a first substrate, enclosing a predetermined region of said one primary surface of the first substrate where an electronic circuit element is formed; forming a first semi-cured adhesion layer on the side surface of the first sealing structure; cutting the upper surface of the first sealing structure with a cutting tool; forming a second sealing structure on a second substrate, corresponding to the first sealing structure; forming a second semi-cured adhesion layer on the side surface of the second sealing structure; cutting the upper surface of the second sealing structure with the cutting tool; causing the first sealing structure and the second sealing structure adhered with each other, and performing thermal processing to adhere the first adhesion layer and the second adhesion layer to each other; and performing thermal processing further after the first adhesion layer and the second adhesion layer have cured so as to bond the first sealing structure and the second sealing structure to each other by solid phase diffusion bonding.

According to the present invention, the adhesion layer is formed on the side surfaces of the first sealing structure on the first substrate and the second sealing structure on the second substrate, whereby when the first sealing structure and the second sealing structure are bonded to each other, the adhesion between the first sealing structure and the second sealing structure can be sufficiently ensured.

Thus, according to the present invention, the first sealing structure on the first substrate and the second sealing structure on the second substrate can be bonded to each other without failure. Furthermore, the first sealing structure on the first substrate and the second sealing structure on the second substrate are bonded by intermetallic solid phase diffusion bonding, whereby very high sealing performance can be ensured. Furthermore, chips may not be sealed in large sealing packages, which can contribute to small-sizing. Wafer level-chip size package (WL-CSP) can be used, and in addition, it is not necessary to seal chips in expensive sealing packages, which can decrease the fabrication cost. Accordingly, the present invention can provide, without large cost increase and larger-sizing, electronic devices which can ensure high sealing performance.

According to the present invention, the first electrode on the first substrate and the second electrode on the second substrate can be integrated with each other by intermetallic solid phase diffusion bonding without being melted, which prevents the first electrode and the second electrode from being melted to spread horizontally when the first electrode and the second electrode are bonded to each other.

Thus, according to the present invention, even when the first electrode and the second electrode are formed at a small pitch, the short-circuit between the neighboring first electrode and second electrode can be prevented. Accordingly, the present invention can provide electronic device of very high reliability.

Furthermore, according to the present invention, the upper portions of the first sealing structure and of the first electrode on the first substrate are cut, and the upper portions of the second sealing structure and of the second electrode on the second substrate are cut, whereby the upper surface of the first sealing structure (opposed to the second sealing structure) and the upper surface of the second sealing structure (opposed to the first sealing structure), and the upper surface of the first electrode (opposed to the second electrode) and the upper surface of the second electrode (opposed to the first electrode) are very flat.

Accordingly, sufficient contact areas can be obtained between the first sealing structure and the second sealing structure and between the first electrode and the second electrode. Thus, according to the present invention, the bonding can be provided by very good intermetallic solid phase diffusion bonding without applying high pressure from the outside or setting high thermal processing temperatures.

BRIEF DESCRIPTION OF THE DRAWINGS

FIGS. 10A to 10C are views of the electronic device according to the first embodiment of the present invention in the steps of the method for fabricating the electronic device, which illustrate the method (Part 9).

DETAILED DESCRIPTION OF THE INVENTION

A First Embodiment

Figure 1:
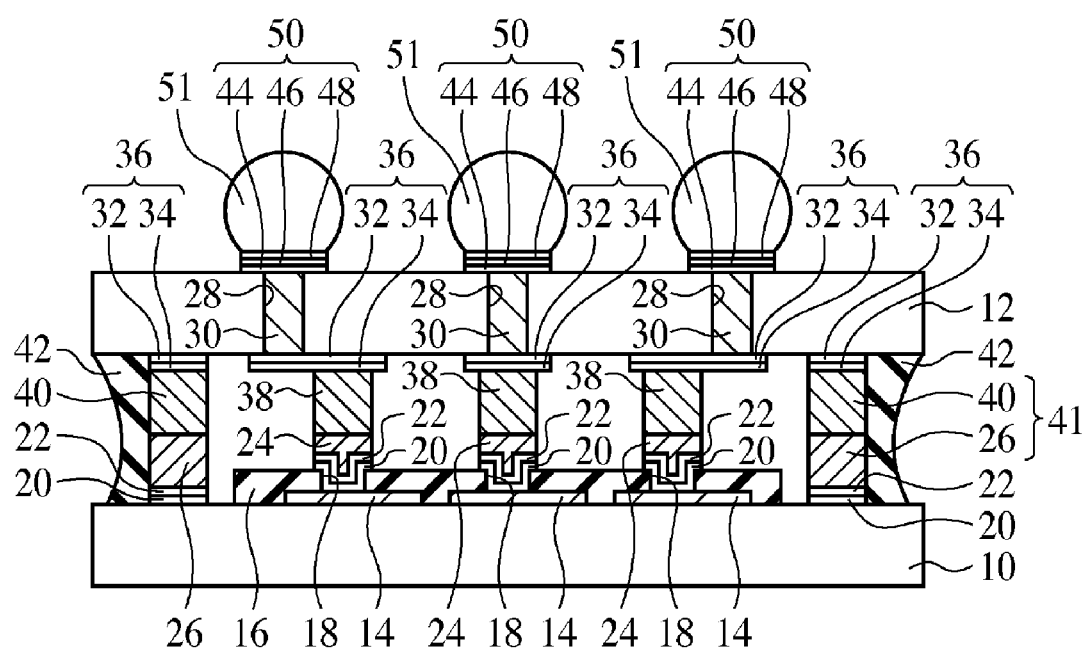
FIG. 1 is a sectional view of the electronic device according to a first embodiment of the present invention.

The electronic device according to a first embodiment of the present invention and the method for fabricating the electronic device will be explained with reference to FIGS. 1 to 13C. FIG. 1 is a sectional view of the electronic device according to the present embodiment.

(The Electronic Device)

As illustrated in FIG. 1, the electronic device according to the present embodiment, a semiconductor substrate 10 and a sealing substrate 12 are opposed to each other.

In predetermined regions of one primary surface of the semiconductor substrate 10, an integrated circuit (not illustrated) including electronic circuit elements (not illustrated) comprising semiconductor elements, such as transistors, etc. is formed.

That is, in the predetermined regions of one primary surface of the semiconductor substrate 10, active devices, such as transistors, etc. (not illustrated) and/or passive devices, such as capacitors, etc. (not illustrated) are formed. On the semiconductor substrate 10 with such electronic circuit elements formed on, a multilayer interconnection structure including a plurality of inter-layer insulation films and interconnections layers is formed, electrically interconnecting the electronic circuit elements (not illustrated).

In FIG. 1, of a plurality of layers of interconnections, the uppermost interconnections 14 alone are illustrated.

The uppermost interconnections 14 are for electrically connecting the integrated circuit (not illustrated) formed on the semiconductor substrate 10 to the outside and is electrically connected to the electronic circuit elements (not illustrated), etc. via conductor plugs (not illustrated) and interconnections (not illustrated).

The semiconductor substrate 10 is, e.g., a silicon substrate. The interconnections 14 are, e.g., aluminum (Al), copper (Cu) or others.

On the semiconductor substrate 10 with the interconnections 14 formed on, a passivation film 16 of, e.g., polyimide is formed. Contact holes 18 are formed in the passivation film 16 down to the interconnections 14.

A layer film 20 of, e.g., a titanium (Ti) film and a Cu film is formed in the contact holes 18. The film thickness of the Ti film is, e.g., 100-300 nm. The film thickness of the Cu film is, e.g., 200 nm-1 μm. The layer film 20 functions as the plating electrode for plating electrodes, etc. on the layer film 20.

A nickel (Ni) film 22, for example, is formed on the layer film 20. The film thickness of the Ni film 22 is, e.g., 1-2 μm. The Ni film 22 functions as the barrier film for preventing the diffusion of the metal material of electrodes, etc. formed on the Ni film 22 to the layer film 20.

Electrodes 24 are formed on the Ni film 22. The electrodes 24 is electrically connected to the electronic circuit elements (not illustrated) formed on the semiconductor substrate 10. The electrode 24 is for electrically connecting the integrated circuit (not illustrated) formed on the semiconductor substrate 10 to the outside. The material of the electrodes 24 is, e.g., a tin (Sn) alloy (Sn-based solder). The material of the electrodes 24 can be Cu or gold (Au) other than the above-described Sn alloy.

The layer film 20 is formed also at the peripheral edge of the semiconductor substrate 10. At this time, the Ni film 22 is formed on the layer film 20 at the peripheral edge of the semiconductor substrate 10.

On the Ni film 22 at the peripheral edge of the semiconductor substrate 10, a sealing structure 26 is formed, enclosing the region where the integrated circuit (not illustrated) including the electronic circuit elements is formed. The sealing structures 26 is for sealing the integrated circuit part with high sealing performance in cooperation with the sealing structure 40. The plane shape of the sealing structure 26 is, e.g., frame-shaped (ring-shaped). The material of the sealing structure 26 is, e.g., an Sn alloy (Sn-based solder). The material of the sealing structure 26 can be Cu or Au other than the above-described Sn alloy.

In the illustrated structure, the upper surfaces of the electrode 24 and the upper surface of the sealing structure 26 are cut with a cutting tool 68 of diamond or others (see FIGS. 4A and 4B) as will be described later. Accordingly, the upper surfaces of the electrodes 24 and the upper surface of the sealing structure 26 are on the same level. The upper surfaces of the electrodes 24 and the upper surface of the sealing structure 26, which are cut with the cutting tool 68 of diamond or others, are very flat.

On the other hand, through-holes 28 are formed in the sealing substrate 12. Vias (through-electrodes) 30 of, e.g., Cu are buried in the through-holes 28. The sealing substrate 12 is a glass substrate or a ceramic substrate.

On one (the surface opposed to the semiconductor substrate 10) of the primary surfaces of the sealing substrate 12, interconnections 36 are formed, connected to the vias 30. The electrodes 38 on the side of the sealing substrate 12 are positioned, opposed to the electrodes 24 on the side of the semiconductor substrate 10. The outside connection electrodes 50 are positioned corresponding to the pitch of the electrodes of an outside apparatus. The electrodes 24 on the side of the semiconductor substrate 10 are arranged, in many cases, at a relatively small pitch, but the outside connection terminals 50 are arranged, in many cases, at a relatively large pitch so as to ensure the reliability of the flip chip bonding.

The interconnections 36 are formed so as to electrically connect the electrodes 24 and the outside connection electrodes 50, which are positioned at the positions different from each other. The interconnections 36 are formed of the layer film of a Cu film 32 and an Ni film 34 laid the former on the latter. The film thickness of the Cu film 32 is, e.g., 2-10 μm. The thickness of the Ni film 34 is, e.g., 1-2 μm.

On one surfaces of the interconnections 36, (which are opposed to the semiconductor substrate 10), electrodes 38 are formed. The electrodes 38 are for electrically connecting the interconnections 36 to the electrodes 24. The material of the electrodes 38 is, e.g., Au. The electrodes 38 are positioned opposed to the electrodes 24 formed on the side of the semiconductor substrate 10. The material of the electrodes 38 can be an Sn alloy or Cu other than Au.

The Cu film 32 is formed also on the peripheral edge of the sealing substrate 12. The Ni film 34 is also formed on one surface (opposed to the semiconductor substrate 10) of the Cu film 32 formed on the peripheral edge of the sealing substrate 12.

A sealing structure 40 is formed on one surface (opposed to the semiconductor substrate 10) of the Ni film 34 formed on the peripheral edge of the sealing substrate 12. The sealing structure 40 seals in cooperation with the sealing structure 26 on the semiconductor substrate 10 the predetermined region where the integrated circuit part formed. The plane shape of the sealing structure 40 is, e.g., rectangular frame-shaped (or ring-shaped) so as to form corresponding to the sealing structure 26 on the side of the semiconductor substrate 10.

The material of the sealing structure 40 can be Au. An Sn alloy or Cu other than Au can be used.

In the illustrated structure, parts of the electrodes 38 (parts of the surfaces opposed to the electrodes 24) and a part of the sealing structure 40 (a part opposed to the sealing structure 26) are cut with the cutting tool 68 of diamond or others (see FIGS. 11A and 11B) as will be described later. Accordingly, the lower surfaces of the electrodes 38 (opposed to the electrodes 24) and one surface of the sealing structure 40 (opposed to the sealing structure 26) are on the same level.

The one surfaces of the electrodes 38 (opposed to the electrodes 24) and the one surface of the sealing structure 40 (opposed to the sealing structure 26) are very flat.

On the side surfaces of the sealing structures 26, 40, an adhesion layer 42 of a thermosetting resin is formed. The adhesion layer 42 is for ensuring the adhesion the between the sealing structure 26 and the sealing structure 40 to each other and ensuring the adhesion between the electrodes 24 and the electrodes 38 when they are bonded to each other.

When the adhesion layer 42 is not formed on the side surfaces of the sealing structures 26, 40, it is necessary that a pressure is applied to the wafer from the outside by any pressurizing means when the sealing structure 26 and the sealing structure 40 are bonded to each other with intermetallic solid phase diffusion bonding and the electrodes 24 and the electrodes 38 are bonded with intermetallic solid phase diffusion bonding. From the viewpoint of the fabrication equipment, it is very difficult to set on applying a pressure to a number of the wafers from the outside for a long period of time.

On the other hand, in the present embodiment, because of the adhesion layer 42 formed on the side surfaces of the sealing structures 26, 40, the sealing structure 26 and the sealing structure 40 are set in close contact with each other without failure and the electrode 24 and the electrode 38 are set in close contact with each other without failure. That is, the adhesion between the sealing structure 26 and the sealing structure 40, and the adhesion between the electrodes 24 and the electrodes 38 can be ensured by the adhesion layer 42.

Thus, according to the present embodiment, after the sealing structure 26 and the sealing structure 40 are adhered to each other, and the electrodes 24 and the electrodes 38 are adhered to each other, without applying a pressure to the wafer from the outside for a long period of time, the intermetallic solid phase diffusion bonding between the sealing structure 26 and the sealing structure 40 and the intermetallic solid phase diffusion bonding between the electrodes 24 and the electrodes 38 can be set on without failure.

The sealing structure 26 on the side of the semiconductor substrate 10 and the sealing structure 40 on the side of the sealing substrate 12 are bonded with the intermetallic solid phase diffusion bonding. The sealing structure 26 and the sealing structure 40 constitute the sealing unit 41.

One surface of the sealing structure 26 (opposed to the sealing structure 40) and one surface of the sealing structure 40 (opposed to the sealing structure 26) are very flat, and the contact area between the sealing structure 26 and the sealing structure 40 is sufficiently large, whereby very good intermetallic solid phase diffusion bonding can be obtained between the sealing structure 26 and the sealing structure 40.

Thus, sufficient sealing performance is ensured between the sealing structure 26 on the side of the semiconductor substrate 10 and the sealing structure 40 on the side of the sealing substrate 12.

The electrodes 24 on the side of the semiconductor substrate 10 and the electrodes 38 on the side of the sealing substrate 12 are also bonded to each other with intermetallic solid phase diffusion bonding. The electrodes 24 on the side of the semiconductor substrate 10 and the electrodes 38 on the side of the sealing substrate 12 are integrated with the intermetallic solid phase diffusion bonding, whereby the contact resistance between the electrodes 24 on the semiconductor substrate 10 and the electrodes 38 on the sealing substrate 12 is sufficiently low.

On the other primary surface of the sealing substrate 12 (not opposed to the semiconductor substrate 10), a Cu film 44 is formed, connected to the via 30. The film thickness of the Cu film 44 is, e.g., 2 μm. An Ni film 46 is formed on one surface of the Cu film 44 (not opposed to the semiconductor substrate 10). The film thickness of the Ni film 46 is, e.g., 1-2 μm. An Au film 48 is formed on one surface of the Ni film 46 (not opposed to the semiconductor substrate 10).

The film thickness of the Au film 48 is, e.g., 1 μm. The Cu film, the Ni film 46 and the Au film 48 constitute the outside connection electrodes 50.

On the outside connection electrodes 50, solder bumps 51 of, e.g., Sn-based solder, are formed.

Thus, the electronic device according to the present embodiment is constituted.

The electronic device according to the present embodiment is characterized mainly in that the sealing structure 26 formed on one substrate 10 and the sealing structure 40 formed on the other substrate 12 are integrated with each other by the intermetallic solid phase diffusion bonding, and the adhesion layer 42 is formed on the side surface of the sealing structure 26 on one substrate 10 and the side surface of the sealing structure 40 formed on the other substrate 12.

According to the present embodiment, because of the adhesion layer 42 formed on the side surface of the sealing structure 26 on the side of one substrate 10 and the side surface of the sealing structure 40 on the side of the other substrate 12, the adhesion between the sealing structure 26 on the side of one substrate 10 and the sealing structure 40 on the side of the other substrate 12 can be sufficiently ensured when the former and the latter are bonded with each other with the intermetallic solid phase diffusion bonding.

Thus, the sealing structure 26 on the side of the one substrate 10 and the sealing structure 40 on the side of the other substrate 12 can be integrated with each other by the intermetallic solid phase diffusion bonding without failure. Since the sealing structure 26 on the side of the one substrate 10 and the sealing structure 40 on the side of the other substrate 12 are bonded with the intermetallic solid phase diffusion bonding, it is possible to ensure very high sealing performance.

Chips may not be sealed in a large sealing package, which can contribute to smaller-sizing and may not be sealed in an expensive sealing package, which prevents the cost increase.

Thus, the electronic device according to the present embodiment can ensure high sealing performance without much increasing cost and larger-sizing.

The electronic device according to the present embodiment is characterized also in that the electrodes formed on the side of one substrate 10 and the electrodes 38 formed on the side of the other substrate 12 are integrated with the intermetallic solid phase diffusion bonding.

According to the present embodiment, the electrodes 24 on the side of one substrate 10 and the electrodes 38 on the side of the other substrate 12 are integrated with the intermetallic solid phase diffusion bonding without melt, whereby the electrodes 24, 38 are never collapsed to expand horizontally when the electrodes 24, 38 are connected to each other.

Thus, according to the present embodiment, even when the electrodes 24, 38 are formed at a small pitch, the short-circuit between the electrodes 24, 38 can be prevented, and the electronic device can have very high reliability.

(The Method for Fabricating the Electronic Device)

Next, the method for fabricating the electronic device according to the present embodiment will be explained.

Figure 8A:
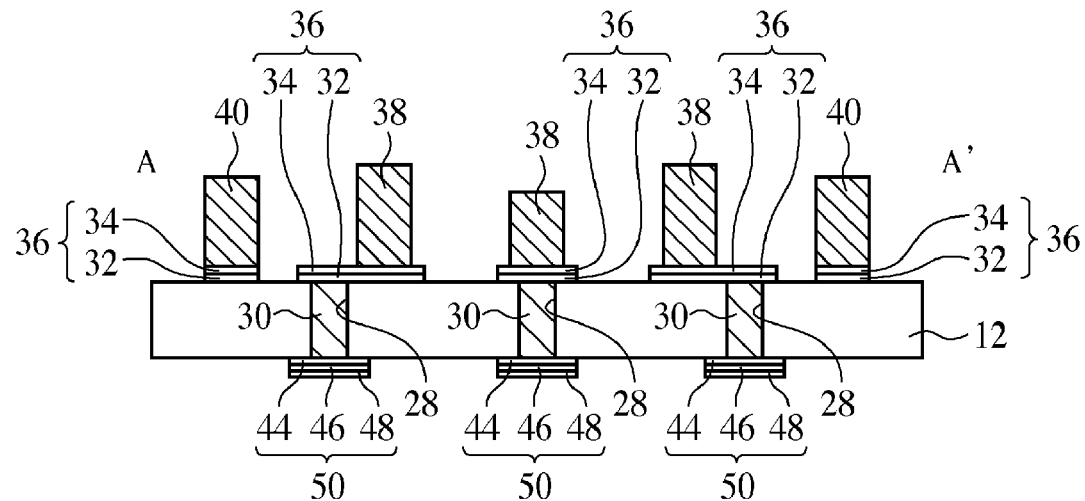
FIGS. 8A and 8B are views of the electronic device according to the first embodiment of the present invention in the steps of the method for fabricating the electronic device, which illustrate the method (Part 7).
Figure 8B:
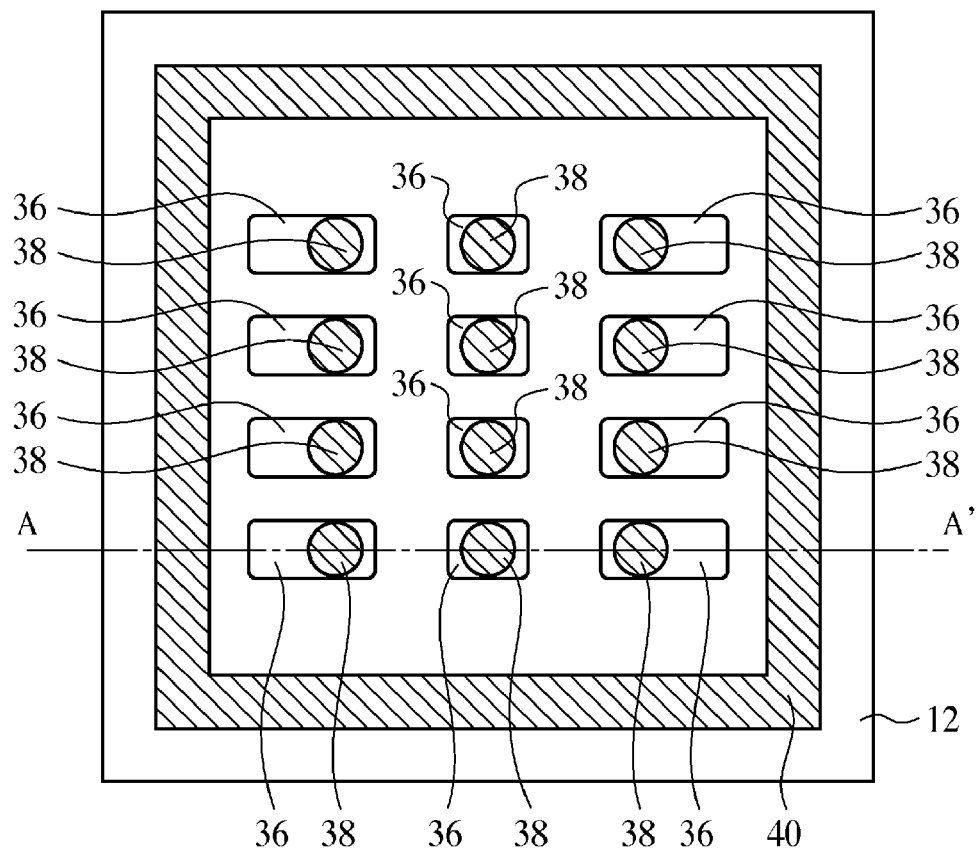
Figure 9A:
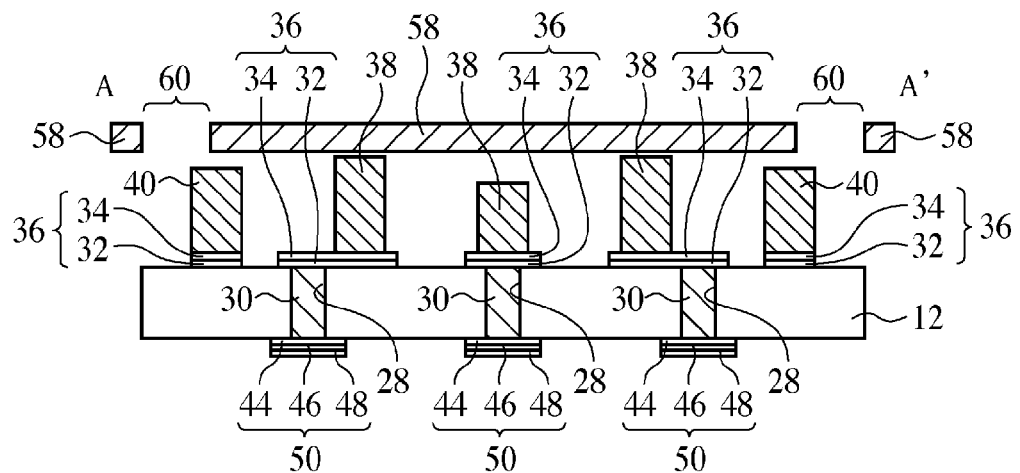
FIGS. 9A and 9B are views of the electronic device according to the first embodiment of the present invention in the steps of the method for fabricating the electronic device, which illustrate the method (Part 8).
Figure 9B:
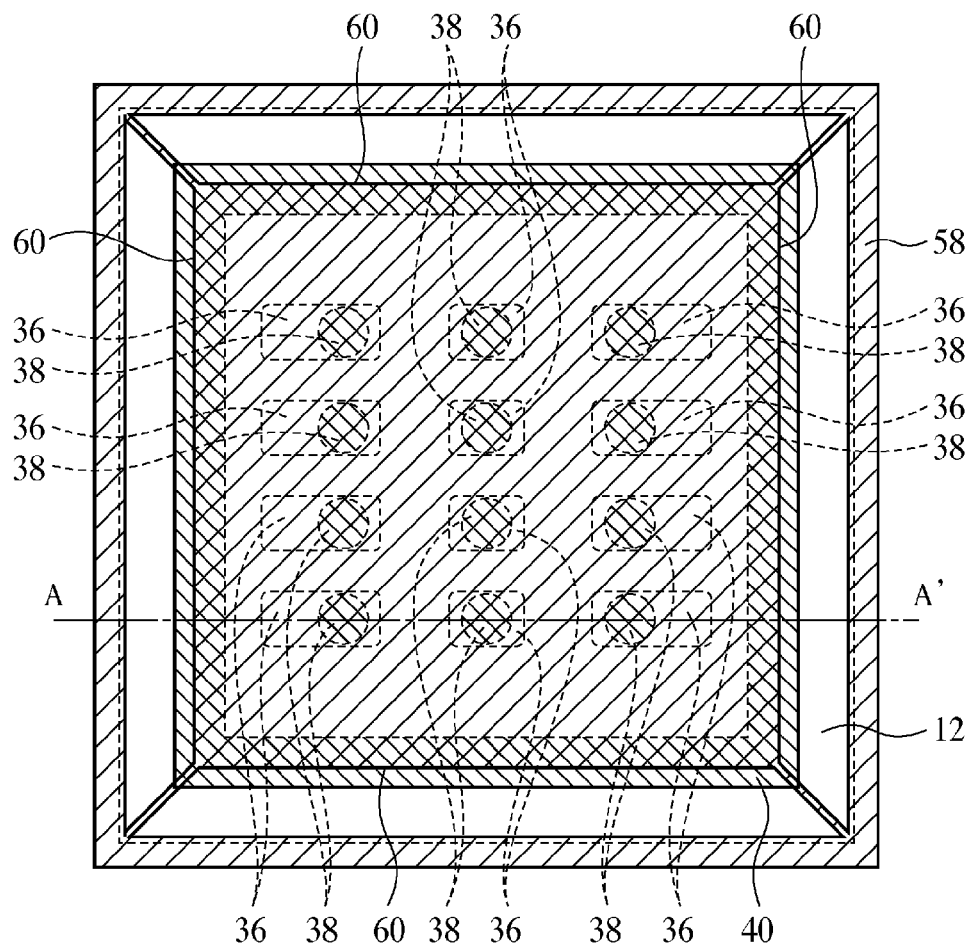

FIGS. 2A to 13C are sectional views of the electronic device according to the present embodiment in the steps of the method for fabricating the electronic device, which illustrate the method. FIGS. 2A to 3B, FIG. 4B, FIG. 5A, FIGS. 6A to 8A, FIG. 9A, FIG. 10A, FIG. 10B, FIG. 11B, FIG. 12A and FIGS. 13A to 13C are sectional views. FIG. 5B, FIG. 8B, FIG. 9B, FIG. 10C and FIG. 12B are plan views. FIG. 5A is the sectional view along the line A-A' in FIG. 5B, and FIG. 8A is the sectional view along the line A-A' in FIG. 8B, FIG. 9A is the sectional view along the line A-A' in FIG. 9B, and FIG. 10B is the sectional view along the line A-A' in FIG. 10C. FIG. 12A is the sectional view along the line A-A' in FIG. 12B.

Figure 2A:
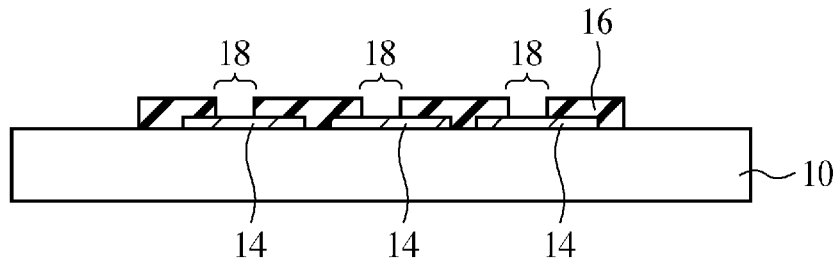
FIGS. 2A to 2C are views of the electronic device according to the first embodiment of the present invention in the steps of the method for fabricating the electronic device, which illustrate the method (Part 1).

In the present embodiment, as illustrated in FIG. 2A, the semiconductor substrate 10 with integrated circuit elements (not illustrated) including electronic circuits comprising semiconductor elements, such as transistors, etc. formed on is prepared.

The semiconductor substrate 10 is not cut in a chip size, i.e., is a wafer. The semiconductor substrate 10 is, e.g., a silicon substrate.

On one of the primary surfaces of the semiconductor substrate 10, a plurality of integrated circuit elements including the electronic circuits comprising semiconductor elements (not illustrated), such as transistors, etc. are formed, but in FIG. 2A, one of the integrated circuit element units is illustrated.

In the respective integrated circuit element units, a multilayer interconnection structure including a plurality of interlayer insulation films and interconnection layers is formed on the surfaces (not illustrated), but in FIG. 2A, the uppermost interconnections 14 alone are illustrated.

The interconnections 14 electrically interconnect the integrated circuit parts formed on the semiconductor substrate 10 and the outside. The interconnections 14 are electrically connected to the electronic circuit parts via conductor plugs (not illustrated) and/or interconnections (not illustrated).

The interconnections 14 are formed of, e.g., Al, Cu or others.

On the semiconductor substrate 10 with the interconnections 14 formed on, the passivation film 16 of polyimide or others is formed, and the contact holes 18 are formed in the passivation film 16 down to the interconnections 14.

Figure 2B:
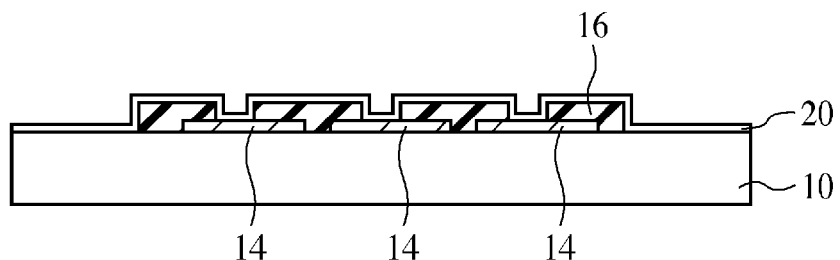
Figure 2C:
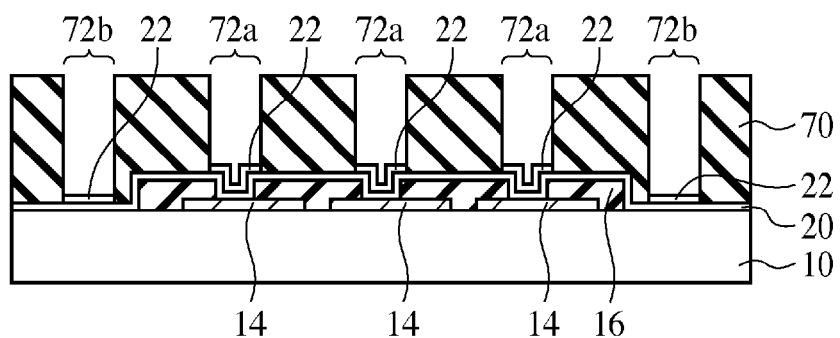

In the present invention, as illustrated in FIG. 2B, the layer film 20 of a Ti film and a Cu film laid one on the other by, sputtering is formed on the entire surface. The film thickness of the Ti film is, e.g., 10-300 nm, and the film thickness of the Cu film is, e.g., 200 nm-1 µm.

Then, a photoresist film 70 is formed on the semiconductor substrate 10.

Next, the openings 72a, 72b are formed in the photoresist film 70 by photolithography. The openings 72a are for forming the electrodes 24, and the openings 72b are for forming the sealing structure 26.

Next, the Ni film 22 is formed by plating on the layer film 20 exposed in the openings 72a, 72b. The film thickness of the Ni film 22 is, e.g., 1-2 µm (see FIG. 2C).

The Ni film 22 is formed only on the layer film 20 exposed in the openings 72a, 72b here. However, the Ni film 22 may be formed on the entire surface after the layer film 20 is formed and before the photoresist film 70 is formed, and in this case, the Ni film 22 can be formed by sputtering or plating.

Figure 3A:
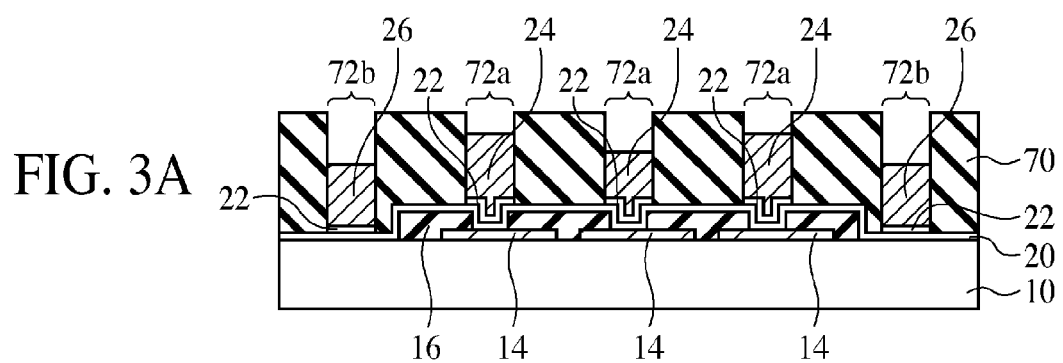
FIGS. 3A and 3B are views of the electronic device according to the first embodiment of the present invention in the steps of the method for fabricating the electronic device, which illustrate the method (Part 2).

Next, as illustrated in FIG. 3A, the electrodes 24 of, e.g., an Sn alloy (Sn-based solder) are formed in the openings 72a by electroplating, and the sealing structure 26 of, e.g., an Sn alloy is formed in the openings 72b. At this time, the electrodes 24 and the sealing structure 26 are formed in, e.g., an about 25 µm-height from the surface of the semiconductor substrate 10.

As the material of the electrodes 24 and the sealing structure 26, Cu or Au other than an Sn alloy can be used.

Then, the photoresist film 70 is removed.

Next, with the Sn alloy layer 24 and the Ni layer 22 as the mask, the exposed parts of the layer film 20 are etched off.

Figure 3B:
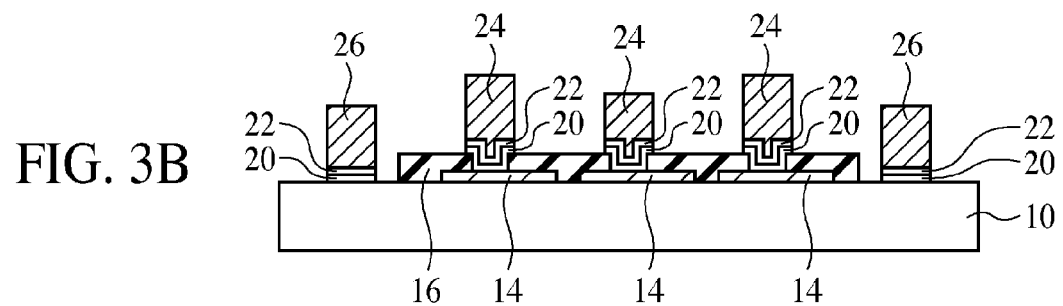

Thus, as illustrated in FIG. 3B, on one of the primary surfaces of the semiconductor substrate 10, the electrodes 24 and the sealing structure 26 are formed. The capsulation structure 26 is formed in a rectangular frame-shape or a ring-shape enclosing each integrated circuit unit.

Figure 4A:
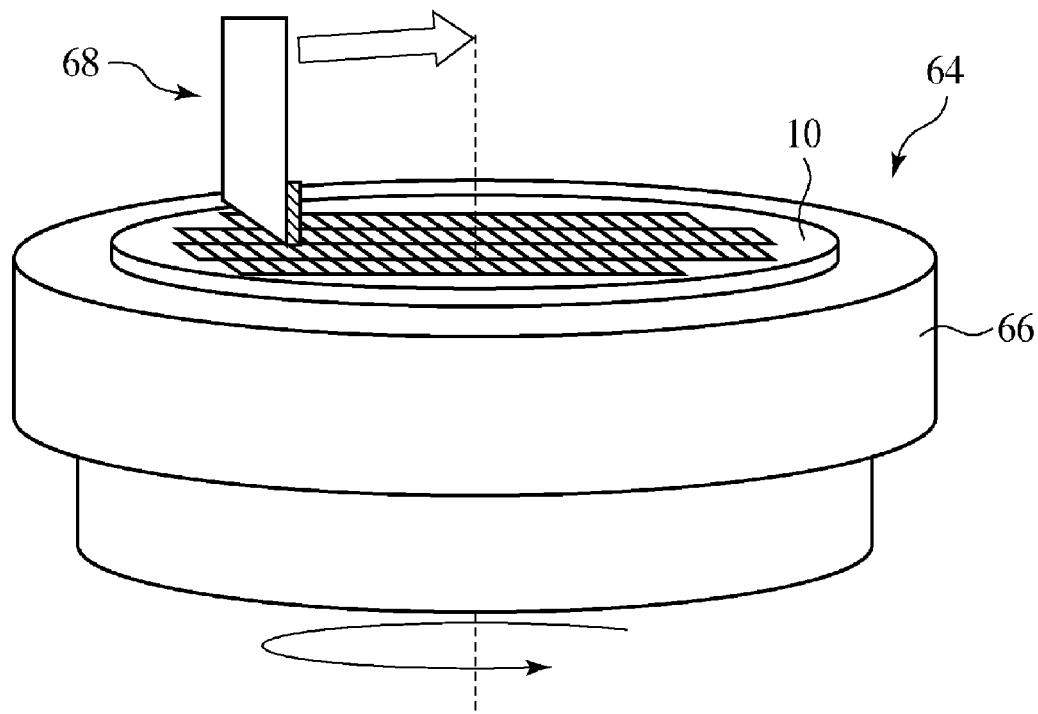
FIGS. 4A and 4B are views of the electronic device according to the first embodiment of the present invention in the steps of the method for fabricating the electronic device, which illustrate the method (Part 3).
Figure 5A:
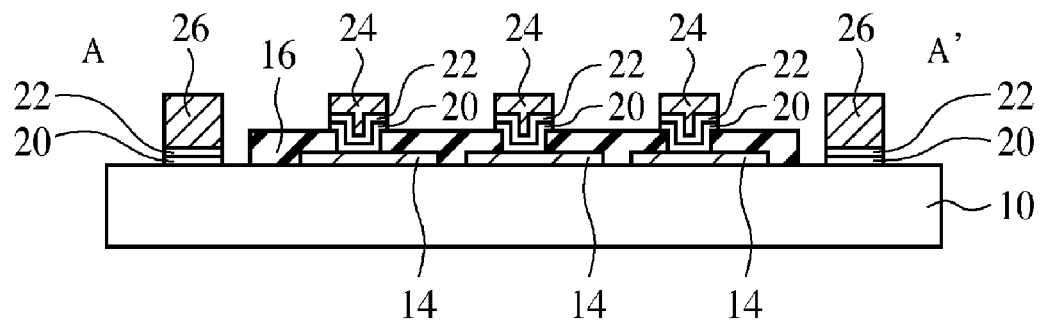
FIGS. 5A and 5B are views of the electronic device according to the first embodiment of the present invention in the steps of the method for fabricating the electronic device, which illustrate the method (Part 4).
Figure 5B:
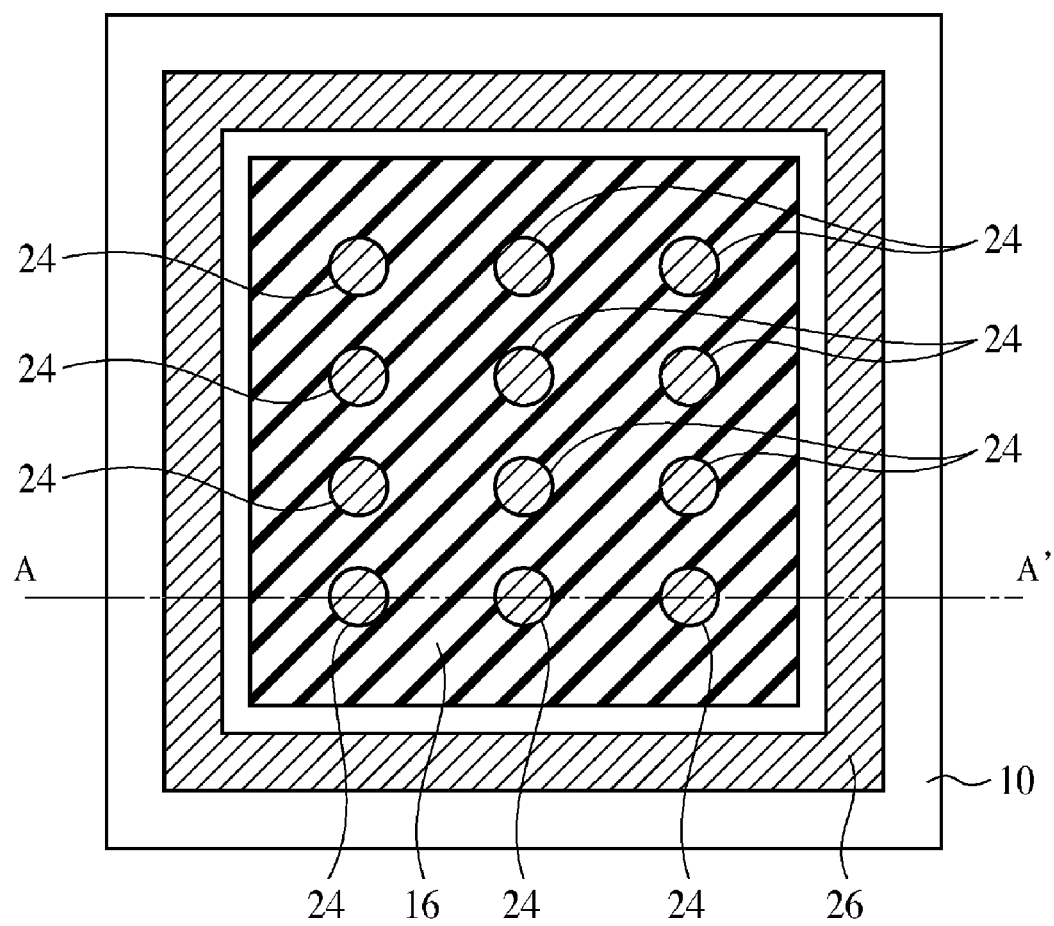

Next, as illustrated in FIG. 4A, the semiconductor substrate 10 is fixed onto a chuck table 66 of an ultraprecise lathe 64 by vacuum suction. FIG. 4A is a perspective view of the semiconductor substrate fixed to the ultraprecise lathe.

The chuck table 66 fixes an object to be machined, such as the substrate or others, when the substrate or others are machined.

When the semiconductor substrate 10 is fixed to the chuck table 66, the underside of the semiconductor substrate 10, i.e., the surface where the electrodes 24 and the sealing structure 26 are not formed is fixed to the chuck table 66. When the semiconductor substrate 10 is fixed onto the chuck table 66, it is preferable to use a pin chuck (not illustrated).

Figure 4B:
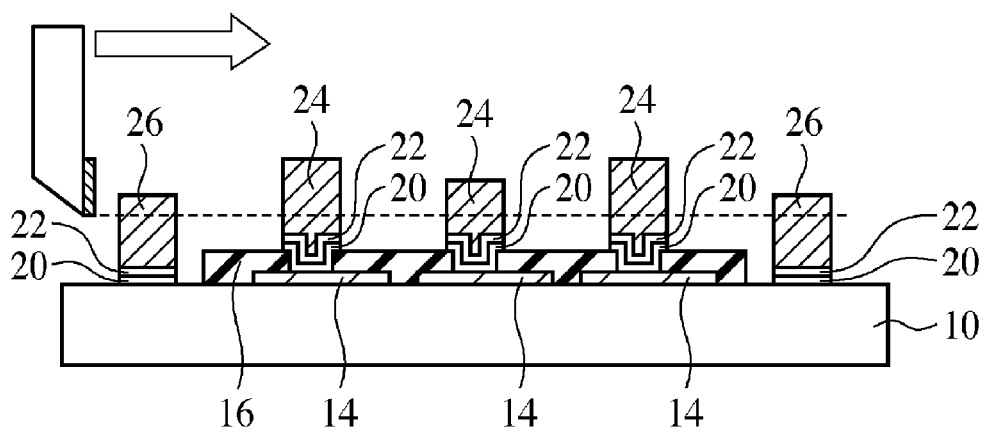

Then, while the semiconductor substrate 10 is being rotated by rotating the chuck table 66, the upper portions of the electrodes and the upper portion of the sealing structure 26 are cut with the cutting tool 68 of diamond (see FIGS. 4A and 4B).

It is also possible to cut the upper portions of the electrodes and the upper portion of the sealing structure 26 by rotating a wheel (not illustrated) mounted with the cutting tool 68 with the semiconductor 10 substrate being fixed (not illustrated).

At this time, the cutting is set on until one surfaces of the electrodes 24 (opposed to the electrodes 38 formed on the sealing substrate 12), one surface of the sealing structure 26 (opposed to the sealing structure 40 formed on the sealing substrate 12) are higher by about 20 µm than one primary surface of the semiconductor substrate 10 (opposed to the sealing substrate 12). The broken line in FIG. 4B indicates the plane cut by the cutting tool 68.

Conditions for cutting the upper portions of the electrodes 24 and the upper portion of the sealing structure 26 are as exemplified below.

The rake angle of the cutting tool 68 is, e.g., 30 degrees.

The rake angle is an angle formed by a plane perpendicular to a cut surface of an object-to-be-cut, and a front surface (the rake face) of the cutting tool blade. Generally, as the rake angle is larger, the cut is better, but the blade is more damaged, and the life of the blade tends to become shorter.

The rotation number of the chuck table 66 is, e.g., about 1000 rpm.

The cut amount of the cutting tool 68 is, e.g., 2 µm. The cut amount is a cut depth of the cutting tool 68 in the cutting.

The feed of the bit 68 is, e.g., 20 µm/rotation. The feed is an advance speed of the cutting tool in the radial direction of the chuck table 66 (i.e., the direction interconnecting one point on the outer edge of the chuck table 66 and the center of the rotation).

The cutting conditions are not limited to the values described above and can be selected suitably for an object to be cut.

When fins are formed on the electrodes 24 in the cutting, there is a risk that the adjacent or neighboring electrodes 24 may short-circuit with each other.

It is preferable to suitably set the cutting conditions so that no fins may not be formed on the electrodes 24 in the cutting.

When chips generated in the cutting intrude between the electrodes 24, there is a risk that the adjacent or neighboring electrodes 24 may be short-circuited with the chips.

In order to prevent the intrusion of chills between the electrodes 24 it is an idea to provide a resin between the electrodes 24 before the cutting, and after the cutting, the resin is removed. However, this adds to the steps. Accordingly, preferably, gas is applied to the cut portions to blow away the chips in the cutting or after the cutting.

Thus, the upper portions of the electrodes 24 and the upper portion of the sealing structure 26 are cut as illustrated in FIG. 5A.

The upper surfaces of the electrodes 24 (opposed to the electrodes 38 formed on the side of the semiconductor substrate 10) and the upper surface of the sealing structure 26 (opposed to the sealing structure 40 formed on the side of the semiconductor substrate 10) are cut continuously with the cutting tool 68 to be resultantly on the same height level.

A plurality of the sealing structures 26 are formed in a rectangular frame-shape or a ring-shape, enclosing the respective circuit units as described above. FIG. 5B illustrates the arrangement of the sealing structure provided for one integrated circuit unit.

Figure 6A:
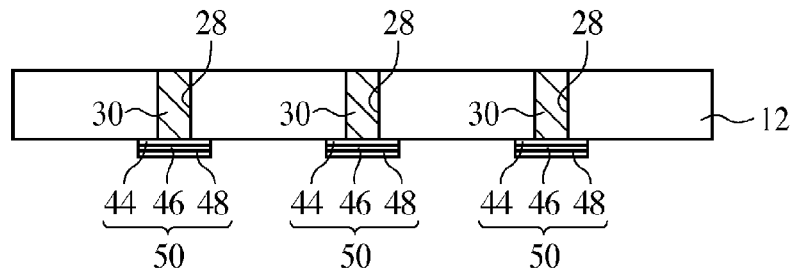
FIGS. 6A to 6D are views of the electronic device according to the first embodiment of the present invention in the steps of the method for fabricating the electronic device, which illustrate the method (Part 5).

On the other hand, as illustrated in FIG. 6A, the sealing substrate 12 with the vias 30, the outside connection electrodes 50, etc. formed in advance is prepared.

The sealing substrate 12 is prepared, not cut in chip sizes. The sealing substrate 12 is, e.g., a glass substrate or a ceramic substrate.

The vias (through electrodes) 30 are buried in the through-holes 28 formed in the sealing substrate 12. The vias 30 are formed of, e.g. Cu.

On one primary surface of the sealing substrate 12 (on the side opposite to the surface opposed to the semiconductor substrate 10), the outside connection electrodes 50 are formed, connected to the vias 30. The vias 30 are electrically connected to the outside via the outside connection electrodes 50. To this end, the vias 30 and the outside connection electrodes 50 are laid out corresponding to the electrodes (not illustrated) of the outside apparatuses (not illustrated).

The outside connection electrodes 50 are formed of the Cu film 44, the Ni film 46 and the Au film 48 sequentially laid former on the latter. The film thickness of the Cu film 44 is, e.g., 2 µm, the film thickness of the Ni film 46 is, e.g., 1-2 µm. The film thickness of the Au film 48 is, e.g., 1 µm.

Figure 6B:
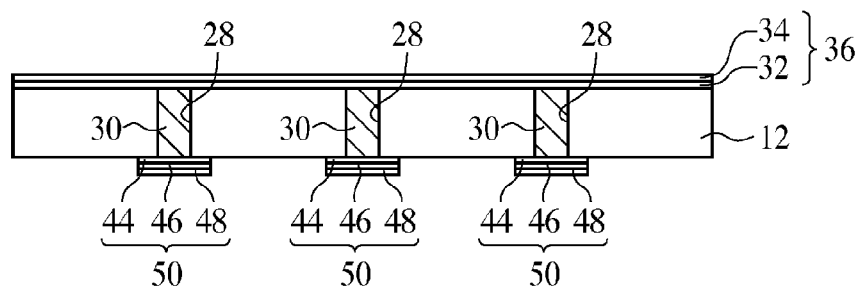

Next, as illustrated in FIG. 6B, the Cu film 32 is formed on the entire surface of the other primary surface of the sealing substrate 12 (opposed to the semiconductor substrate 10) by sputtering or electroplating.

Next, the Ni film 34 is formed on the entire surface of the Cu film 32 by electroplating. The film thickness of the Ni film 34 is, e.g., 1-2 µm. The Ni film 34 may be formed immediately before the electrodes 38 and the sealing structure 40 are formed by electroplating.

Figure 6C:
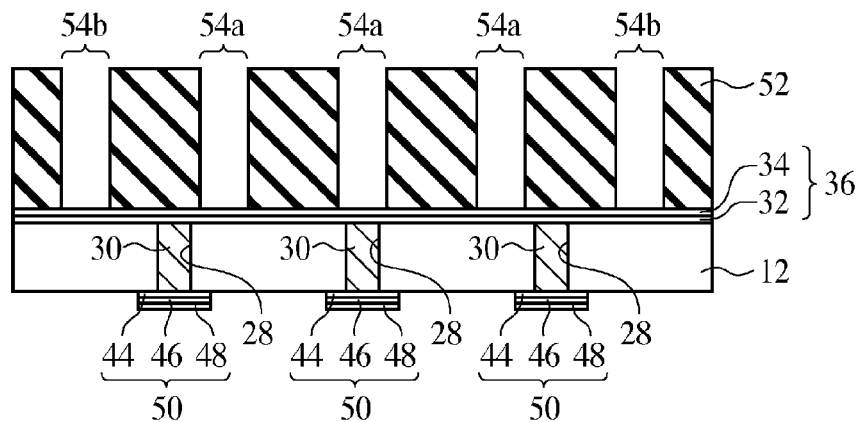

Next, as illustrated in FIG. 6C, a photoresist film 52 is formed on the sealing substrate 12.

Then, the opening 54a, 54b are formed in the first photoresist film 52 by photolithography. The openings 54a are for forming the electrodes 38. Accordingly, the openings 54a are formed, positioned corresponding to the positions where the electrodes 24 on the side of the semiconductor substrate 10 are to be formed. The openings 54b are for forming the sealing structure 40. Accordingly, the openings 54b are formed, positioned corresponding to the position where the sealing structure 40 is to be formed.

Figure 6D:
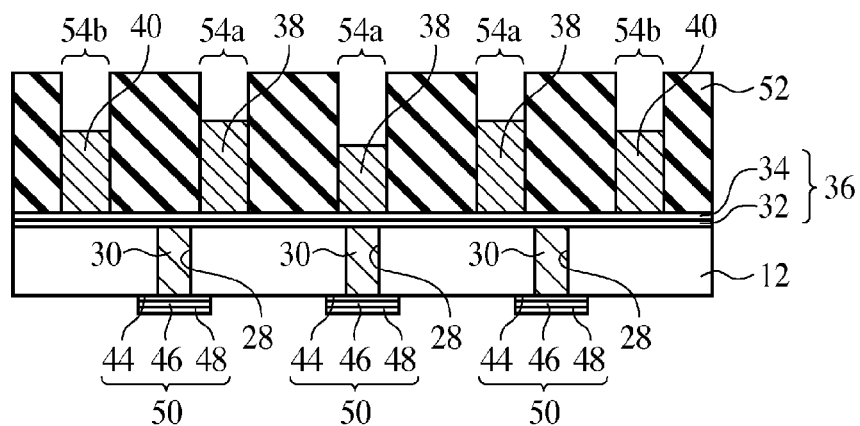

Then, as illustrated in FIG. 6D, by electroplating, the electrodes 38 of, e.g., Au are formed in the openings 54a, and in the openings 54b, the sealing structure 40 of Au is formed. At this time, the electrodes 38 and the sealing structure 40a are formed so that the height of the electrodes 38 and the sealing structure 40 is higher by about 25 µm than the surface of the sealing substrate 12.

Figure 7A:
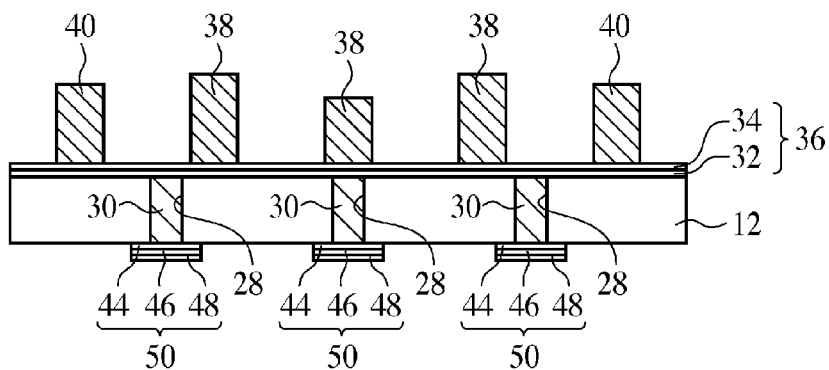
FIGS. 7A to 7C are views of the electronic device according to the first embodiment of the present invention in the steps of the method for fabricating the electronic device, which illustrate the method (Part 6).

Next, as illustrated in FIG. 7A, the first photoresist film 52 is released.

Next, a second photoresist film 56 is formed on the sealing substrate 12.

Figure 7B:
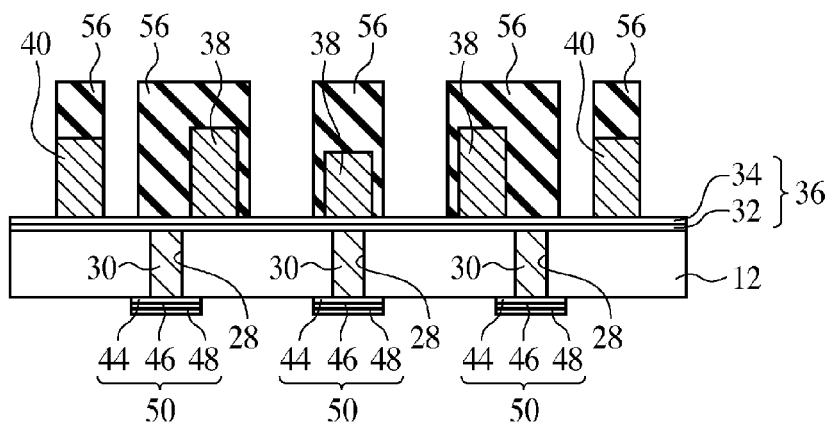

Then, by photolithography, the second photoresist film 56 is patterned in the plane shape of the interconnections 36 (see FIG. 1) (see FIG. 7B).

Figure 7C:
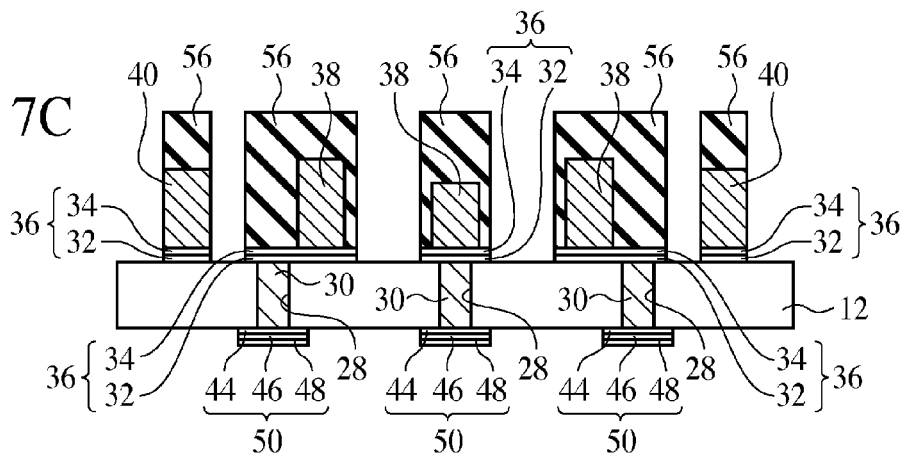

Next, as illustrated in FIG. 7C, with the second photoresist film 56 as the mask, the Ni film 34 and the Cu film 32 are selectively etched to form the interconnections 36 of the Cu film 32 and the Ni film 34. Then, the second photoresist film 56 is released.

Thus, as illustrated in FIGS. 8A and 8B, the interconnections 36, the electrodes 38, the sealing structure 40, etc. are formed on the sealing substrate 12. As illustrated in FIG. 8B, the sealing structure 40 is formed in, e.g., a rectangular frame-shape (or a ring-shape) corresponding to the sealing structure 26 formed on the semiconductor substrate 10.

Next, the adhesion layer 42b is formed on the side surfaces of the sealing structure 40 by printing. Specifically the adhesion layer 42b is formed on the side surface of the sealing structure 40 as follows.

First, as illustrated in FIGS. 9A and 9B, a mask 58 with an opening 60 for exposing the side surface of the sealing structure 40 formed in is placed on the sealing substrate 12.

Then, as illustrated in FIG. 10A, an adhesive 42a is applied with a mask 58, a squeegee 62, etc. The adhesive 42a can be, e.g., B stage adhesive (type: ABLEFLEX 6200) by Ablestik Laboratories.

This adhesive is an epoxy resin group adhesive and has the curing characteristics that before thermal processing, the adhesive is liquid (A stage), semi-cured (B stage) when thermally processed at a relatively low temperature and perfectly cured (C stage) when thermally processed at a higher temperature.

The adhesion layer 42a of the adhesive is thus formed on the side surface of the frame-shaped sealing structure 40. Immediately after the adhesive layer 42a is applied, the adhesive layer 42a has not been yet thermally processed and is liquid (A stage). However, the adhesive layer 42a has relatively high viscosity and is pasty, whereby the adhesive layer 42a never spread excessively horizontally.

Then, the thermal processing is performed under conditions which semi-cure the adhesive layer 42a to thereby change the adhesion layer 42a to an adhesion layer 42b in the semi-cured state (B stage) (see FIGS. 10B and 10C). The thermal processing temperature (a first temperature) is, e.g., 100-130° C., and the thermal processing period of time is, e.g., about 1 hour.

The thermal processing conditions are not limited to the above, and the thermal processing may be performed under conditions for semi-curing the adhesion layer 42a.

Figure 11A:
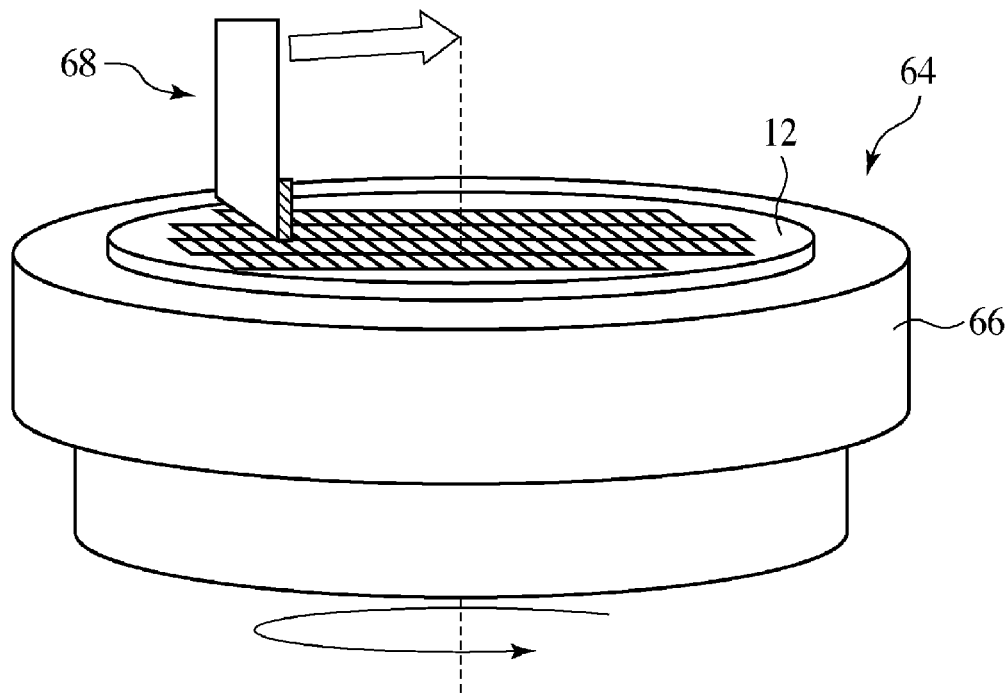
FIGS. 11A and 11B are views of the electronic device according to the first embodiment of the present invention in the steps of the method for fabricating the electronic device, which illustrate the method (Part 10).
Figure 12A:
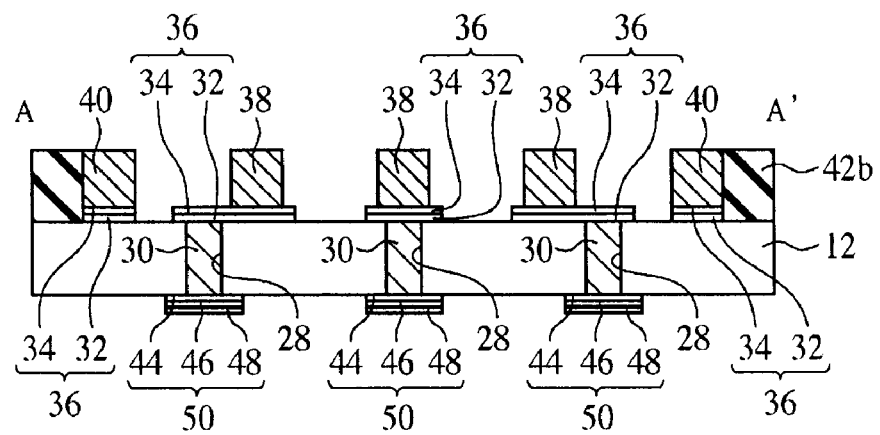
FIGS. 12A and 12B are views of the electronic device according to the first embodiment of the present invention in the steps of the method for fabricating the electronic device, which illustrate the method (Part 11).

Next, as illustrated in FIG. 11A, the sealing substrate 12 is fixed to the chuck table 66 of the ultraprecise lathe 64 by vacuum suction.

FIG. 11A is a perspective view illustrating the sealing substrate fixed to the ultraprecise lathe. When the sealing substrate 12 is fixed to the chuck table 66, the underside of the sealing substrate 12, i.e., the surface where the electrodes 38 and the sealing structure 40 are not formed on is fixed to the chuck table 66.

When the sealing substrate 12 is fixed to the chuck table 66, preferably, a pin chuck is used. The broken line in FIG. 11B indicates a cut surface with the cutting tool 68.

A plurality of the outside connection electrodes 50 are formed on the underside of the sealing substrate 12 but are as thin as several μm, which permits the sealing substrate 12 to be fixed to the chuck table 66 with high repeatability by vacuum suction.

Figure 11B:
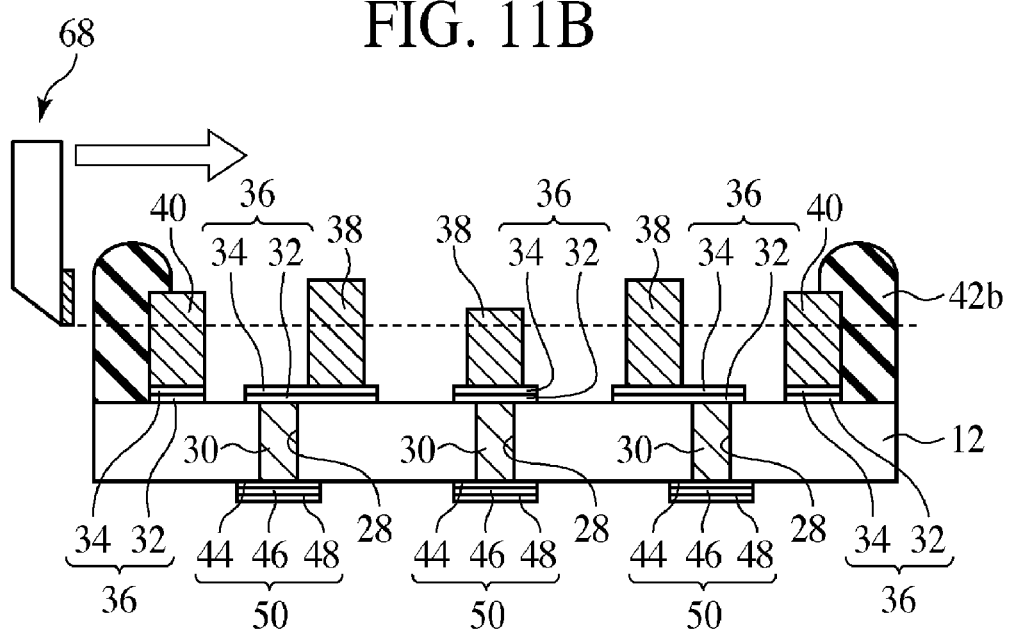

Next, with the sealing substrate 12 set on rotation, the upper portions of the electrodes 38, the upper portion of the sealing structure 40 and the upper surface of the adhesion layer 42b are cut with the cutting tool 68 of diamond (see FIGS. 11A and 11B). At this time, the cutting is performed until one surfaces of the electrodes 38 (opposed to the electrodes 24 formed on the semiconductor substrate 10) and one surface of the sealing structure 40 (opposed to the sealing structure 26 formed on the semiconductor substrate 10) is higher by about 20 μm than the other primary surface of the sealing substrate 12 (opposed to the semiconductor substrate 10).

Conditions for cutting the upper portions of the electrodes 38, the upper portion of the sealing structure 40 and the upper portion of the adhesion layer 42b are as exemplified below.

The rake angle of the cutting tool 68 is, e.g., 30 degrees.

The rotation number of the chuck table 66 is, e.g., about 1000 rpm.

The cut amount of the cutting tool 68 is, e.g., about 2 μm.

The feed of the cutting tool 68 is, e.g., 20 μm/rotations.

When fins are formed on the electrodes 38 in the cutting, there is a risk that the adjacent or neighboring electrodes 38 may short-circuit with each other. It is preferable to suitably set the cutting conditions so that no fins may be formed on the electrodes 38 in the cutting.

When chips generated in the cutting intrude between the electrodes 38, there is a risk that the adjacent or neighboring electrodes 38 may be short-circuited with the chips. In order to prevent the intrusion of chips between the electrodes 38 it is an idea to provide a resin between the electrodes 24 before the cutting, and after the cutting, the resin is removed. However, this adds to the steps. Accordingly, preferably, gas is applied to the cut portions to blow away the chips in the cutting or after the cutting.

Figure 12B:
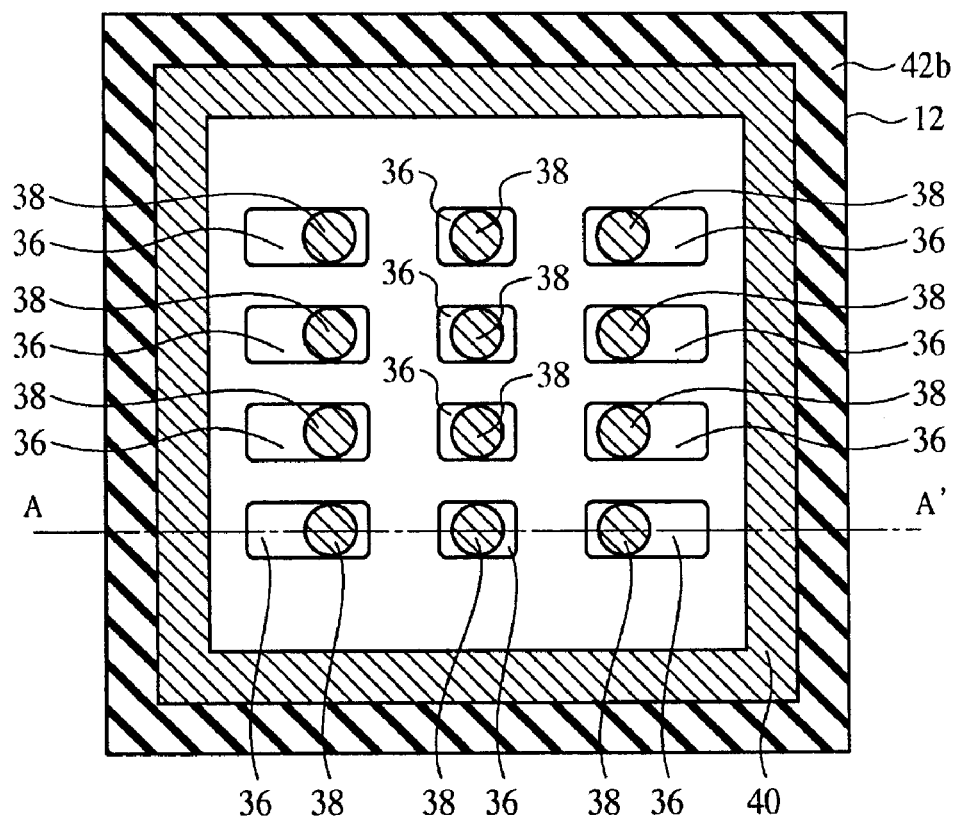

The upper portions of the electrodes 38, the upper portion of the sealing structure 40 and the upper portion of the adhesion layer 42b are thus cut as illustrated in FIGS. 12A and 12B.

The one surfaces of the electrodes 38 (opposed to the electrodes 24 formed on the semiconductor substrate 10), the one surface of the sealing structure 40 (opposed to the sealing structure 26 formed on the semiconductor substrate 10) and one surface of the adhesion layer 42b (opposed to the semiconductor substrate 10) are continuously cut by the cutting tool 68 to be on the same height level.

The sealing structure 40 is formed, positioned corresponding to the sealing structure 26 formed on the semiconductor substrate 10, as described above.

Figure 13A:
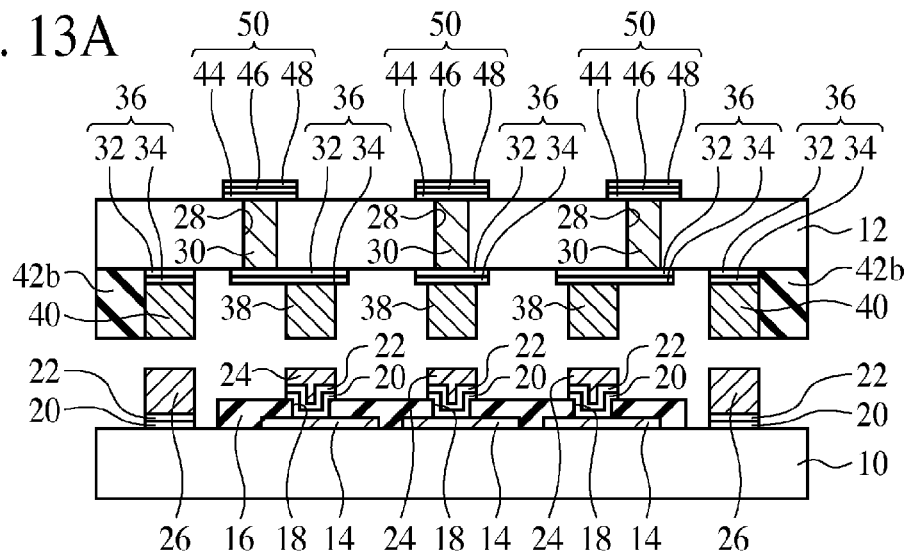
FIGS. 13A to 13C are views of the electronic device according to the first embodiment of the present invention in the steps of the method for fabricating the electronic device, which illustrate the method (Part 12).

Then, as illustrated in FIG. 13A, the semiconductor substrate 10 and the sealing substrate 12 are opposed to each other. At this time, the semiconductor substrate 10 and the sealing substrate 12 are opposed to each other with the electrodes 24 on the semiconductor substrate 10 and the electrodes 38 on the sealing substrate 12 opposed to each other and with the sealing structure 26 on the semiconductor substrate 10 and the sealing structure 40 on the sealing substrate 12 opposed to each other.

In the present embodiment, to make the processing cost low, the semiconductor substrate 10 and the sealing substrate 12 which are not respectively cut in chip sizes are opposed to each other. However, before the semiconductor substrate 10 and the sealing substrate 12 are opposed to each other, the semiconductor substrate 10 and the sealing substrate 12 are respectively cut in chip sizes to be opposed to each other.

Next, thermal processing is performed, applying a pressure, on the semiconductor substrate 10 and the sealing substrate 12 which is positioned upper of the semiconductor substrate 10 with the sealing structure 26 on the side of the semiconductor substrate 10 and the sealing structure 40 on the side of the sealing substrate 12 adhered to each other, and the electrodes 24 on the side of the semiconductor substrate 10 and the electrodes 38 on the side of the sealing substrate 12 adhered to each other.

In the thermal and pressurizing processing, the thermal processing is performed under conditions which do not melt the semi-cured adhesion layer 42b and do not melt the electrodes 38, 24 and the sealing structures 26, 40.

For example, to melt the adhesion layer 42b semi-cured by the thermal processing of 100° C. (a first temperature) and 30 minutes, the thermal processing must be performed at a thermal processing temperature (a second temperature) higher than the first temperature. To be specific, the thermal processing temperature (the second temperature) is, e.g., about 170° C. The thermal processing period of time is, e.g., 5-10 seconds.

The melted adhesion layer 42 arrives at the side surface of the sealing structure 26 on the side of the semiconductor substrate 10, and the adhesion layer 42c is formed on the side surfaces of the sealing structure 26 on the side of the semiconductor substrate 10 and the sealing structure 40 on the side of the sealing substrate 12. After the thermal processing, the temperature is retuned to the room temperature, and the adhesion layer 42c is cured to be again semi-cured (B stage).

Preferably, the thermal processing period of time is relatively short. However, the adhesion layer 42c as again cured is further cured by the thermal processing at a higher thermal processing temperature (the second temperature) higher than a thermal processing temperature (the first temperature) at which the liquid adhesion layer 42a is semi-cured to the adhesion layer 42b. The adhesion layer 42c again cured after the thermal processing of the second temperature never melt again unless thermal processing of a sufficiently higher temperature than the second temperature is performed.

Figure 13B:
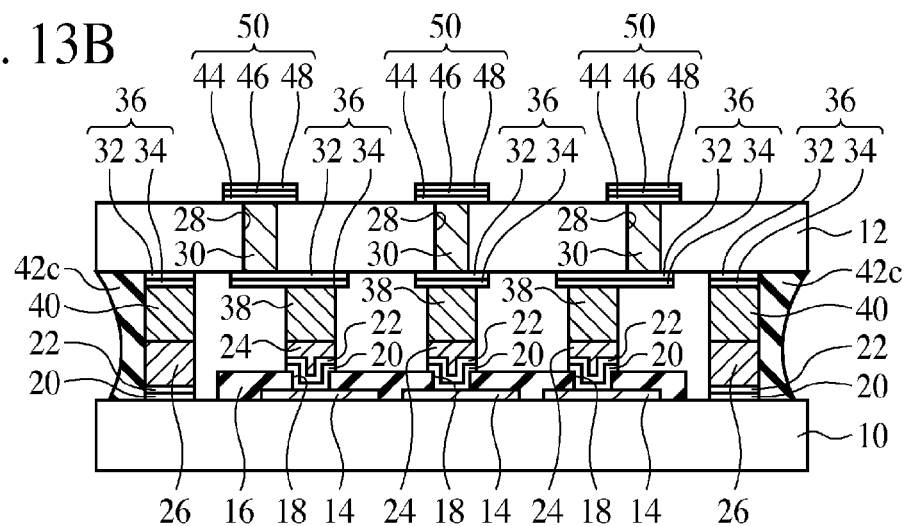

The adhesion layer 42c is formed on the side surface of the sealing structure 26 on the side of the semiconductor substrate 10 and on the side surface of the sealing structure 40 on the side of the sealing substrate 12, whereby the adhesion between the sealing structure 26 on the semiconductor substrate 10 and the sealing structure 40 on the sealing substrate 12, and the adhesion between the electrodes 24 on the side of the semiconductor substrate 10 and the electrodes 38 on the side of the sealing substrate 12 can be ensured by the adhesion layer 42c (see FIG. 13B).

Next, thermal processing is performed with, e.g., an oven (thermal processing apparatus) under conditions which the electrodes 24 and the electrodes 38 are bonded by intermetallic solid phase diffusion bonding, and the sealing structure 26 and the sealing structure 40 are bonded by intermetallic solid phase diffusion bonding. At this time, it is necessary the adhesion between the sealing structure 26 on the side of the semiconductor substrate 10 and the sealing structure 40 on the side of the sealing substrate 12, and the adhesion between the electrodes 24 on the side of the semiconductor substrate 10 and the electrodes 38 on the side of the sealing substrate 12 are ensured by the adhesion layer 42c. To this end, the thermal processing is performed at a thermal processing temperature (a third temperature) which does not melt the semi-cured adhesion layer 42c.

Specifically, the thermal processing is performed at a thermal processing temperature (a third temperature) which is not much higher than the thermal processing temperature (the second temperature) at which the adhesion layer 42b has been melted, whereby while the adhesion layer 42c is prevented from melting, the intermetallic solid phase diffusion bonding between the electrodes 24 and the electrodes 38 and the intermetallic solid phase diffusion bonding between the sealing structure 26 and the sealing structure 40 can be accelerated. The thermal processing temperature (the third temperature) is, e.g., 150-170° C., and the thermal processing period of time is, e.g., 1 hour.

This thermal processing integrates the sealing structure 26 on the side of the semiconductor substrate 10 and the sealing structure 40 on the side of the sealing substrate 12 with each other by the intermetallic solid phase diffusion bonding and integrates the electrodes 24 of the side of the semiconductor substrate 10 and the electrodes 38 on the side of the sealing substrate 12 with each other by the intermetallic solid phase diffusion bonding. This thermal processing makes the semi-cured (B stage) adhesion layer 42c the perfectly cured (C stage) adhesion layer 42.

Without the adhesion layer 42c on the side surfaces on the sealing structures 26, 40, when the sealing structure 26 and the sealing structure 40 are bonded by the intermetallic solid phase diffusion bonding, and the electrodes 24 and the electrodes 38 are bonded by the intermetallic solid phase diffusion bonding, a pressure must be applied from the outside by some pressurizing means for a long period of time. From the viewpoint of the fabrication equipments, it is very difficult to apply a pressure to a number of wafers for a long period of time.

In the present embodiment, however, the adhesion layer 42c is formed on the side surfaces of the sealing structures 26, 40, whereby the sealing structure 26 and the sealing structure 40 are fixed, securely adhered to each other, and the electrodes 24 and the electrodes 38 are fixed, securely adhered to each other.

That is, the adhesion layer 42c ensures the adhesion between the sealing structure 26 and the sealing structure 40 and the adhesion between the electrodes 24 and the electrodes 38. Thus, according to the present embodiment, without applying a pressure from the outside for a long period of time after the sealing structure 26 and the sealing structure 40 have been adhered to each other, and the electrodes 24 and the electrode 38 have been adhered to each other, the intermetallic solid phase diffusion bonding between the sealing structure 26 and the sealing structure 40 and the intermetallic solid phase diffusion bonding between the electrodes 24 and the electrodes 38 can be advanced without failure.

Figure 13C:
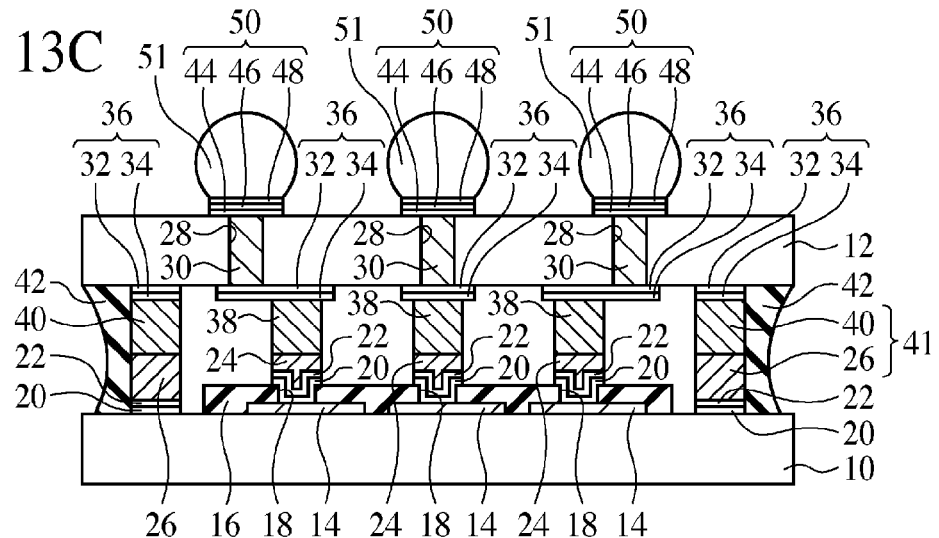

Next, the solder bumps 51 of, e.g., an Sn-based solder are formed on the outside connection electrodes 50 (see FIG. 13C).

The solder bumps 51 are formed here after the sealing structure 26 and the sealing structure 40 have been bonded by the intermetallic solid phase diffusion bonding, and the electrodes 24 and the electrodes 38 have been bonded by the intermetallic solid phase diffusion bonding but may be formed before the semiconductor substrate 10 and the sealing substrate 12 have been opposed.

Then, the semiconductor substrate 10 and the sealing substrate 12 adhered to each other (of the wafer size) is cut in chip sizes with a thin blade formed of diamond particles, etc. bound with a binding agent. This processing is unnecessary when the semiconductor substrate 10 and the sealing substrate 12 have been cut and separated in advance.

Thus, the electronic device according to the present embodiment is fabricated.

One characteristic of the method for fabricating the electronic device according to the present embodiment is that the adhesion layer 42c is formed in advance on the side surface of the sealing structure 26 on the side of one substrate 10 and the side surface of the sealing structure 40 on the side of the other substrate 12, whereby the adhesion between the sealing structure 26 on the side of one substrate 10 and the sealing structure 40 on the side of the other substrate 12 can be ensured by the adhesion layer 42c. Then, the thermal processing is performed with the adhesion between the electrodes 24 on the side of one substrate 10 and the electrodes 38 on the side of the other substrate 12 ensured, whereby the sealing structure 26 on the side of one substrate 10 and the sealing structure 40 on the side of the other substrate 12 are bonded with each other by the intermetallic solid phase diffusion bonding, and the electrodes 24 on the side of one substrate 10 and the electrodes 38 on the side of the other substrate 12 are bonded with each other by the intermetallic solid phase diffusion bonding.

The bonding strength between the sealing structure 26 on the side of one substrate 10 and the sealing structure 40 on the side of the other substrate 12 is not sufficient when the former and the latter are adhered to each other. However, according to the present embodiment, the adhesion between the sealing structure 26 on the side of one substrate 10 and the sealing structure 40 on the side of the other substrate 12 can be made sufficient to integrate both with each other with sufficient bonding strength.

Thus, according to the present embodiment, the sealing structure 26 on the side of one substrate 10 and the sealing structure 40 on the side of the other substrate 12 can be surely integrated with each other by the intermetallic solid phase diffusion bonding. The sealing structure 26 on the side of one substrate 10 and the sealing structure 40 on the side of the other substrate 12 are integrated with each other by the intermetallic solid phase diffusion bonding, whereby very high sealing performance can be ensured.

Furthermore, the chips must not be sealed in large sealing packages, which can contribute to the down-sizing.

According to the present embodiment, the electronic device can be fabricated by the so-called wafer level-chip size package (WL-CSP) without the necessity of sealing the chips in expensive sealing packages, which allows the electronic device to be fabricated at low costs.

Thus, the electronic device according to the present embodiment can have surely high sealing performance without large cost increases and size increases.

Another characteristic of the method for fabricating the electronic device according to the present embodiment is that the electrodes 24 formed on the side of one substrate 10 and the electrodes 38 formed on the side of the other substrate 12 can be integrated with each other by the intermetallic solid phase diffusion bonding without melt.

According to the present embodiment, the electrodes 24, 38 are integrated with each other by the intermetallic solid phase diffusion bonding without melt, whereby the electrodes 24, 38 never spread horizontally when the electrodes 24 and the electrodes 38 are adhered t each other to be bonded. Accordingly, even when the electrodes 24, 38 are formed at a very small pitch, the short-circuit between the adjacent electrodes 24, 38 can be prevented.

That is, the electronic device according to the present embodiment can have very high reliability.

Further another characteristic of the method for fabricating the electronic device according to the present embodiment is that the upper portion of the sealing structure 26 and the upper portions of the electrodes 24 are cut, and the upper portion of the sealing structure 40 and the upper portions of the electrodes 38 are cut; and the sealing structure 26 having the upper portion cut and the sealing structure 40 having the upper portion cut are integrated with each other by the intermetallic solid phase diffusion bonding, and the electrodes 24 having the upper portions cut and the electrodes 38 having the upper portions cut are integrated with each other by the intermetallic solid phase diffusion bonding.

When the sealing structure and the electrodes are formed on the substrates, concavities and convexities are present in the surfaces of the sealing structures and the electrodes. When such sealing structures and such electrodes are bonded respectively with each other by the intermetallic solid phase diffusion bonding, good bonding cannot be made because of small contact areas. Both can be bonded to some extent respectively with each other by applying high pressure from the outside and setting the thermal processing temperature relatively high. However, from the viewpoint of the fabrication equipments, it is very difficult to keep applying pressure to a number of wafers from the outside for a long period of time. When the thermal processing temperature is set relatively high, there is a risk that the sealing structures and the electrodes may be melted.

In the present embodiment, however, the upper portion of the sealing structure 26 and the upper portions of the electrodes 24 are cut, and the upper portion of the sealing structure 40 and the upper portions of the electrodes 38 are cut, whereby the upper surfaces of the sealing structures 26, 40 and the upper surfaces of the electrodes 24, 38 are made very flat. Accordingly sufficient contact areas can be provided between the sealing structure 26 and the sealing structures 40 and between the electrodes 24 and the electrodes 38. Thus, according to the present embodiment, without applying high pressure from the outside and setting the thermal processing temperature high, very good junction can be made by the intermetallic solid phase diffusion bonding.

(Modifications)

Next, the method for fabricating the electronic device according to a modification of the present embodiment will be explained with reference to FIGS. 14A to 17C.

FIGS. 14A to 17C are sectional views of the electronic device according to the present modification in the steps of the method for fabricating the electronic device, which illustrate the method. FIGS. 14A to 14C, FIG. 15B, FIG. 16A and FIGS. 17A to 17C are sectional views. FIG. 16B is a plan view. FIG. 16A is the sectional view along the line A-A' in FIG. 16B.

The method for fabricating the electronic device according to the present modification is characterized in that an adhesion layer 73b of an adhesive is formed on the side surfaces of the sealing structures by applying the adhesive 73a of a photosensitive resin to the entire surface of the substrates, semicuring the adhesive 73a and patterning the semi-cured adhesive 73b.

In the same way as in the method for fabricating the electronic device described above with reference to FIGS. 2A to 5B, the electrodes 24, the sealing structure 26, etc. are formed on the semiconductor substrate 10.

The steps of fabricating the electrodes 24, the sealing structure 26, etc. on the semiconductor substrate 10 is the same as that described above with reference to FIGS. 2A to 5B, and the explanation will not be repeated here.

The steps of forming the interconnections 36, the electrodes 38 and the sealing structure 40 on the sealing substrate 12 are the same as those of the electronic device fabricating method described above with reference to FIGS. 6A to 8B are the same, and their explanation will not be repeated.

Figure 14A:
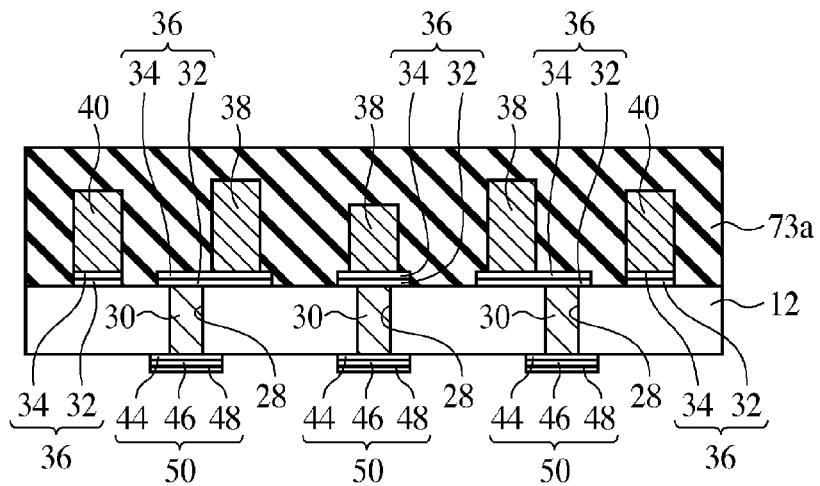
FIGS. 14A to 14C are views of the electronic device according to a modification of the first embodiment of the present invention in the steps of the method for fabricating the electronic device, which illustrate the method (Part 1).

Next, as illustrated in FIG. 14A, the adhesive 73a of a photoresist resin is applied to the entire surface. The adhesive agent 73a can be, e.g., a photosensitive insulation film by JSR Corporation (trade name: WPR).

The adhesive 73a is liquid (A stage) before the thermal processing, semi-cured (B stage) by the thermal processing of a predetermined temperature, and perfectly cured (C stage) by the thermal processing of a higher temperature. Furthermore, the adhesive 73a is photosensitive.

Then, the adhesive 73a is thermally processed under conditions which semi-cure the adhesive 73a. The thermal processing temperature (a fourth temperature) is, e.g., 130° C. The thermal processing period of time is, e.g., 3-30 minutes. Thus, the liquid adhesive 73a become a semi-cured (B stage) adhesive 73b.

Figure 14B:
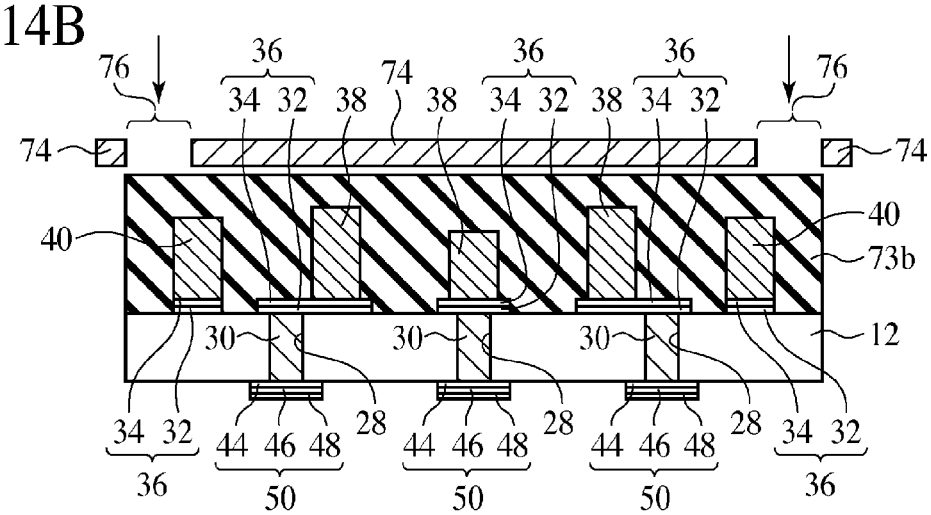
Figure 14C:
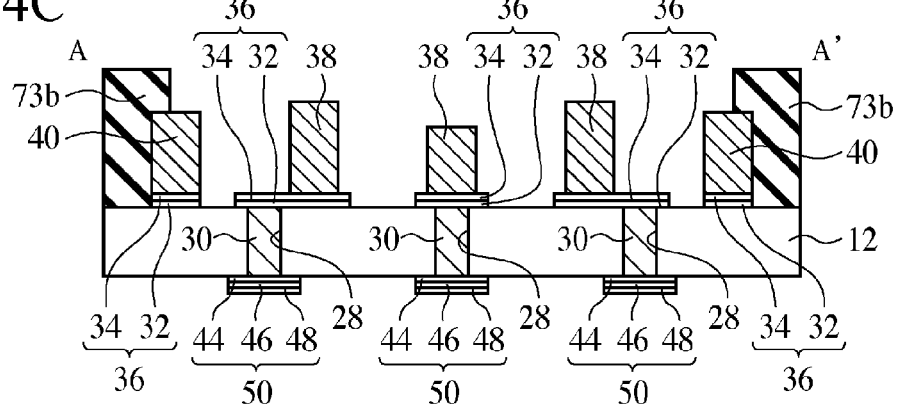

Next, as illustrated in FIG. 14B, a mask 74 with an opening 76 for exposing the side surface of the sealing structure 40 formed in is placed over the sealing substrate 12.

Next, UV rays are exposed by using the mask 74. Thus, the adhesive 73b exposed in the opening 76 is exposed by the UV rays.

Then, the adhesive 73b is developed. Thus, the adhesion layer 73b of the adhesive is formed on the side surface of the sealing structure 40 on the side of the sealing substrate (see FIG. 14C).

Figure 15A:
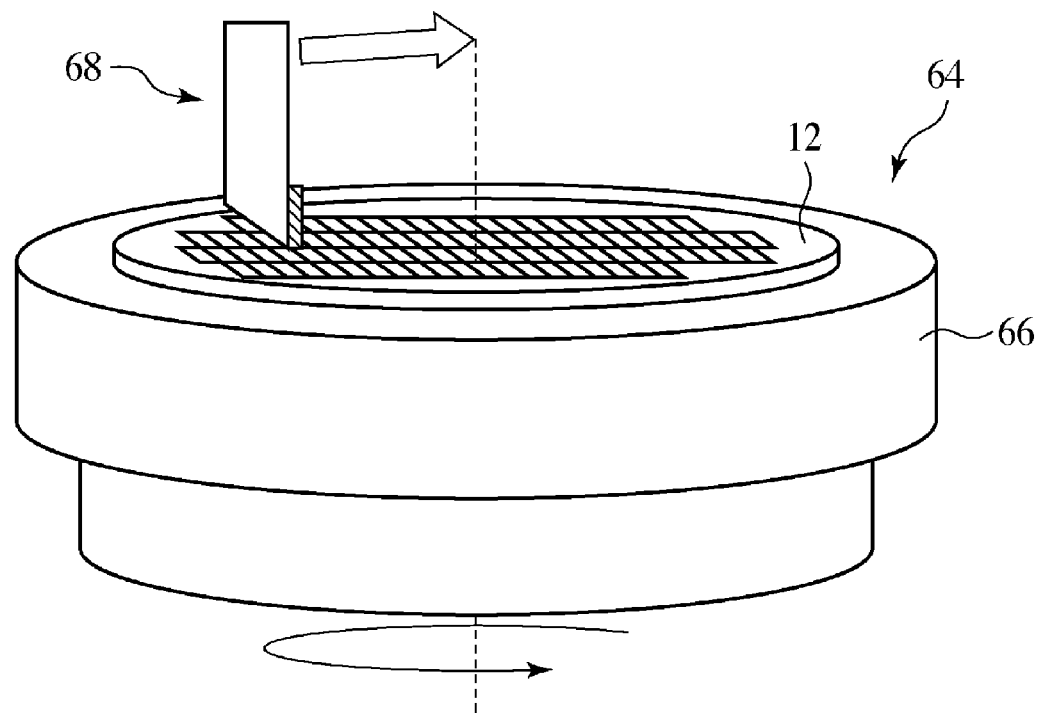
FIGS. 15A and 15B are views of the electronic device according to a modification of the first embodiment of the present invention in the steps of the method for fabricating the electronic device, which illustrate the method (Part 2).

Then, as illustrated in FIG. 15A, the sealing substrate 12 is fixed to the chuck table 66 of an ultraprecise lathe 66 by vacuum suction. FIG. 15A is a perspective view of the sealing substrate fixed to the ultraprecise lathe.

Figure 15B:
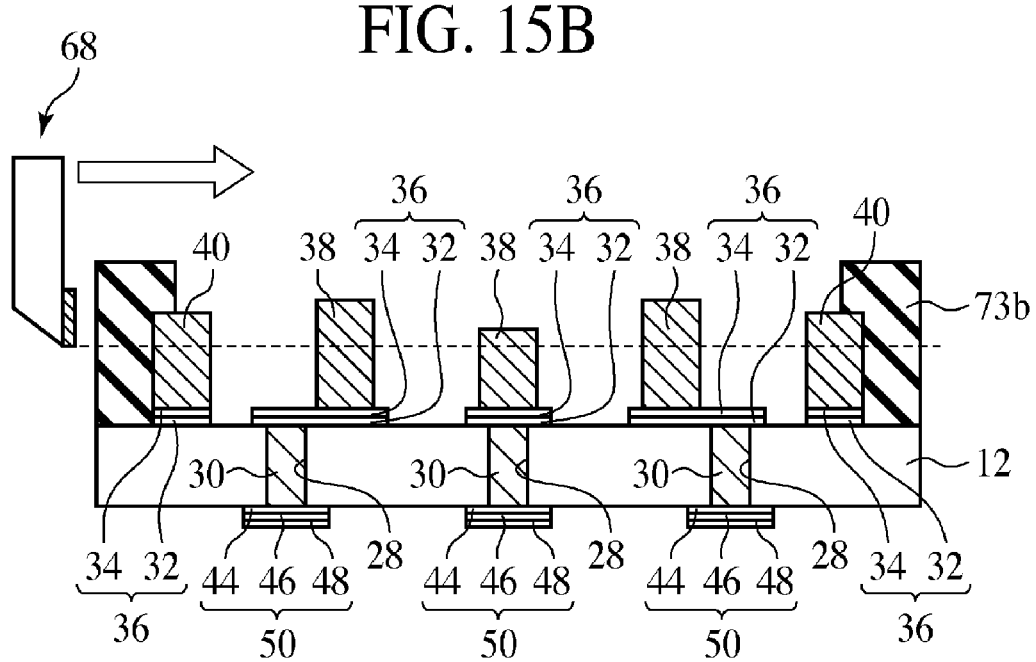
Figure 16A:
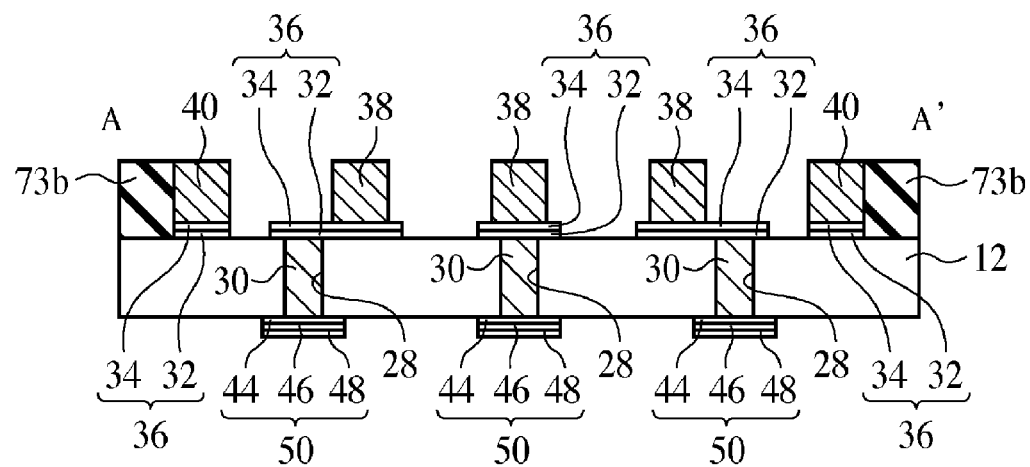
FIGS. 16A and 16B are views of the electronic device according to a modification of the first embodiment of the present invention in the steps of the method for fabricating the electronic device, which illustrate the method (Part 3).
Figure 16B:
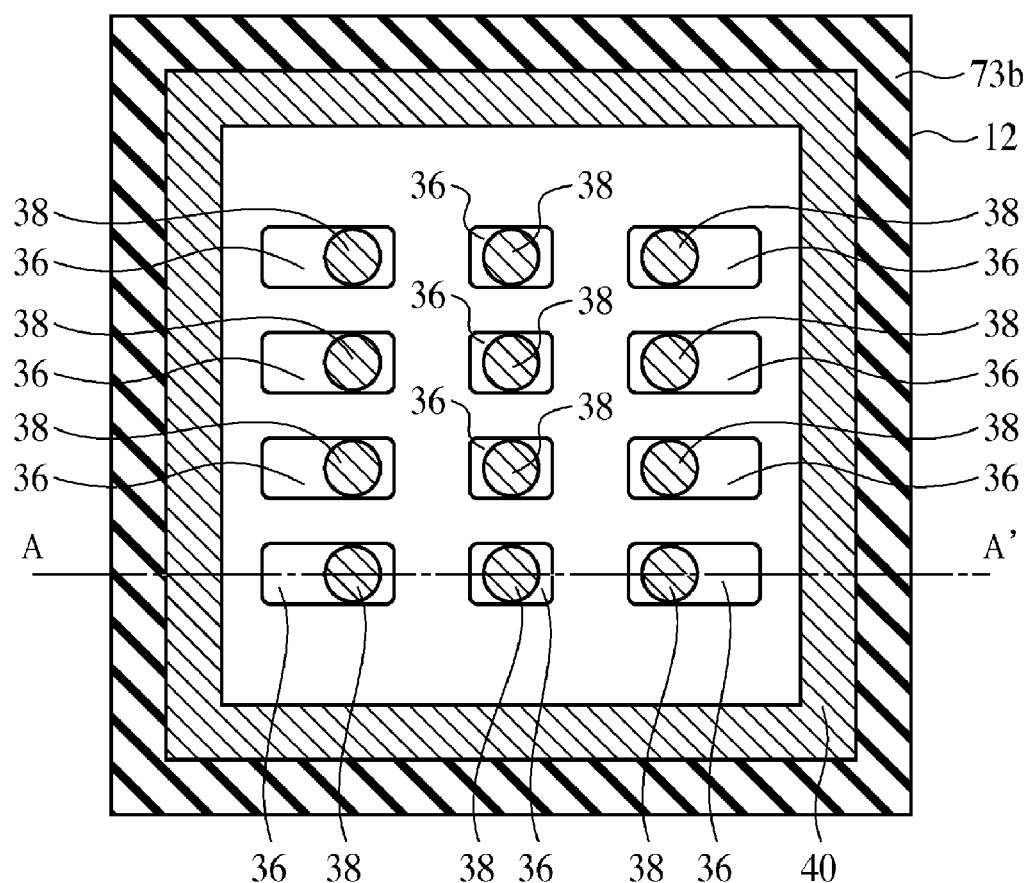

Then, with the sealing substrate 12 set on rotation, the upper portions of the electrodes 38, the upper portion of the sealing structure 40 and the upper portion of the adhesion layer 73b are cut (see FIGS. 15A and 15B) by the cutting tool 68 of diamond. At this time, the cut is set on until the upper surfaces of the electrodes 38 (opposed to the electrodes 24 formed on the semiconductor substrate 10), the upper surface of the sealing structure 40 (opposed to the sealing structure 26 formed on the semiconductor substrate 10) and the upper surface of the adhesion layer 73b are higher by about 20 μm than one primary surface of the sealing substrate 12 (opposed to the semiconductor substrate 10). In FIG. 15B, the broken lines indicate the cut surface with the cutting tool 68.

Conditions for cutting the upper portions of the electrodes 38, the upper portion of the sealing structure 40 and the upper portion of the adhesion layer 73b are as exemplified below.

The rake angle of the cutting tool 68 is, e.g., 30 degrees. The rotation number of the chuck table 66 is, e.g., about 1000 rpm. The cut amount of the cutting tool 68 is, e.g., about 2 μm. The feed of the cutting tool 68 is, e.g., 20 μm/rotations.

When fins are formed in cutting the electrodes 38, there is a risk that the adjacent or neighboring electrodes 38 may short-circuit with each other. It is preferable to suitably set the cutting conditions so that no fins are formed in the electrodes 38 in the cutting.

Thus, the upper portions of the electrodes 38, the upper portion of the sealing structure 40 and the upper portion of the adhesion layer 73b are cut. The upper portions of the electrodes 38, the upper portion of the sealing structure and the upper portion of the adhesion layer 73b are continuously cut with the cutting tool 68, whereby the upper surfaces of the electrodes 38 (opposed to the electrodes 24 on the semiconductor substrate 10), the upper surface of the sealing structure 40 (opposed to the sealing structure 26 formed on the semiconductor substrate 10) and the upper surface of the adhesion layer 73b (opposed to the semiconductor substrate 10) are on the same height level (see FIGS. 16A and 16B).

Figure 17A:
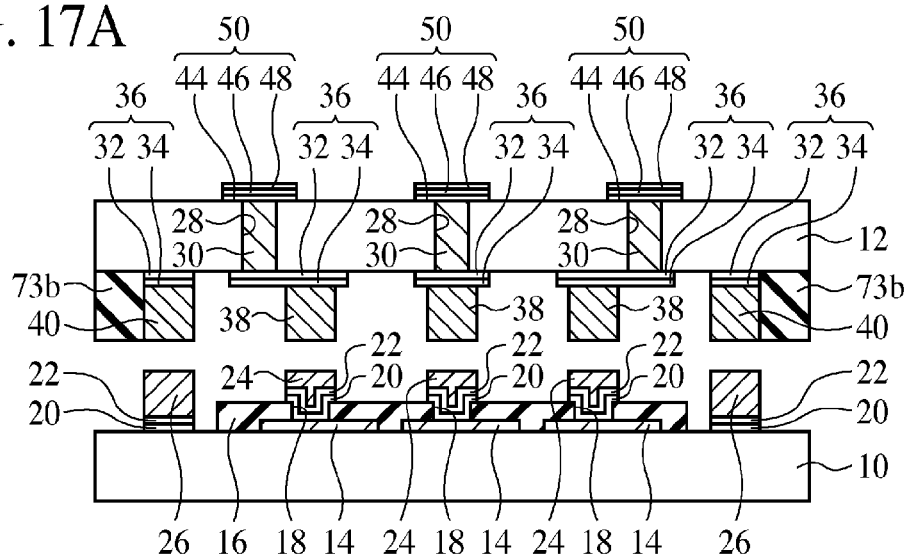
FIGS. 17A to 17C are views of the electronic device according to a modification of the first embodiment of the present invention in the steps of the method for fabricating the electronic device, which illustrate the method (Part 4).
Figure 17B:
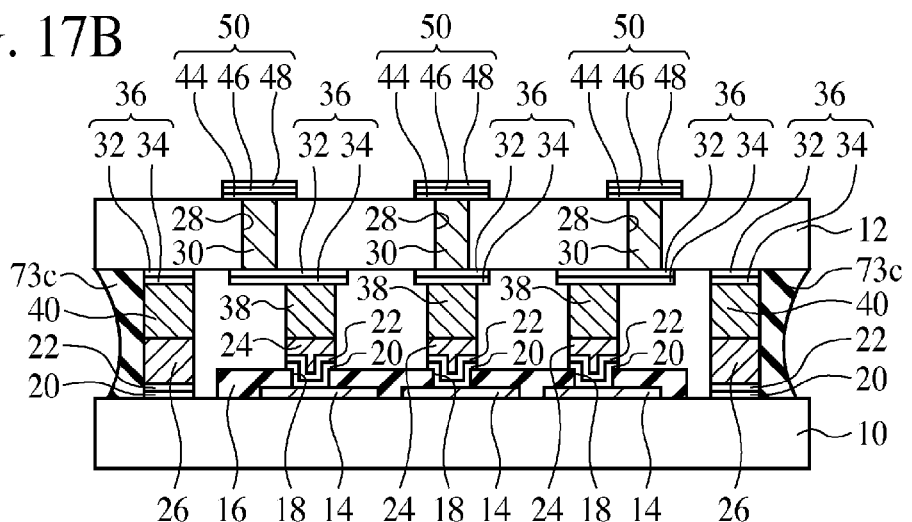

Next, as illustrated in FIG. 17A, the semiconductor substrate 10 and the sealing substrate 12 are opposed to each other.

At this time, the semiconductor substrate 10 and the sealing substrate 12 are opposed with the electrodes 24 on the side of the semiconductor substrate 10 opposed to the electrodes 38 on the side of the sealing substrate 12 and with the sealing structure 26 on the side of the semiconductor substrate 10 and the electrodes 38 on the side of the sealing substrate 12 opposed to each other.

The semiconductor substrate 10 and the sealing structure 12 may be respectively cut in chip sizes before the semiconductor substrate 10 and the sealing substrate 12 are opposed to each other.

Then, the thermal processing is performed, while applying a pressure, on the semiconductor substrate 10 and the sealing substrate 12 positioned upper of the semiconductor substrate 10 with the sealing structure 26 on the side of the semiconductor substrate 10 and the sealing structure 40 on the side of the sealing substrate 12 adhered to each other and with the electrodes 24 on the side of the semiconductor substrate 10 and the electrodes 38 on the side of the sealing substrate 12 adhered to each other.

At this time, the thermal processing is performed under conditions which do not melt the semi-cured adhesion layer 73b and the electrodes 38, 24 and the sealing structures 26, 40. To melt the adhesion layer 73b semi-cured at the fourth temperature, it is necessary to perform the thermal processing at a thermal processing temperature (a fifth temperature) higher than the fourth temperature. The thermal processing temperature (the fifth temperature) is, e.g., about 190° C., and the thermal processing period of time is, e.g., 5-10 seconds.

The melted adhesion layer 73b arrives at the side surface of the sealing structure 26 on the semiconductor substrate 10, whereby the adhesion layer 73c is formed on the side surface of the sealing structure 26 on the semiconductor substrate 10 and the side surface of the sealing structure 40 on the sealing substrate 12.

After the thermal processing, the adhesion layer 73c is cured to be semi-cured (B stage). However, the cure of the adhesion layer 73c as re-cured is further advanced, because the thermal processing is performed at the thermal processing temperature (the fifth temperature) higher than the thermal processing temperature (the fourth temperature) for curing the liquid adhesion layer 73a to the semi-cured adhesion layer 73b. The adhesion layer 73c which has been again cured after the thermal processing at the fifth temperature never melt again unless the adhesion layer 73c is thermally processed at a temperature sufficiently higher than the fifth temperature.

Thus, the adhesion layer 73c is formed on the side surface of the sealing structure 26 on the side of the semiconductor substrate 10 and the side surface of the sealing structure 40 on the side of the sealing substrate 12. Then, the adhesion layer 73c ensures the adhesion between the sealing structure 26 on the side of the semiconductor substrate 10 and the sealing structure 40 on the side of the sealing substrate 12, and the adhesion between the electrodes 24 on the side of the semiconductor substrate 10 and the electrodes 38 on the side of the sealing structure 12 (see FIG. 17B).

Then, thermal processing is performed with, e.g., an oven (thermal processing apparatus) under conditions which integrate and bond the electrodes 24 and the electrodes 38 with each other by the intermetallic solid phase diffusion bonding, and integrate and bond the sealing structure 26 and the sealing structure 40 with each other by the intermetallic solid phase diffusion bonding.

At this time, the adhesion between the sealing structure 26 on the side of the semiconductor substrate 10 and the sealing structure 40 on the side of the sealing substrate 12, and the adhesion between the electrodes 24 on the side of the semiconductor substrate 10 and the electrodes 38 on the side of the sealing substrate 12 must be ensured by the adhesion layer 73c. To this end, the thermal processing is performed at a thermal processing temperature (a sixth temperature) which never melts the semi-cured adhesion layer 73c.

Specifically, the thermal processing is performed at the thermal processing temperature (the sixth temperature) which is not much higher than the thermal processing temperature (the fifth temperature), at which the adhesion layer 73b has been melted, whereby the melt of the adhesion layer 73c is prevented while the intermetallic solid phase diffusion bonding can be advanced. The thermal processing temperature (the sixth temperature) is, e.g., 190° C. The thermal processing period of time is, e.g., 1 hours. This thermal processing integrates the sealing structure 26 on the side of the semiconductor substrate 10 and the sealing structure 40 on the side of the sealing substrate 12 with each other by the intermetallic solid phase diffusion bonding, and integrates the electrodes 24 on the side of the semiconductor substrate 10 and the electrodes 38 on the side of the sealing substrate 12 with each other by the intermetallic solid phase diffusion bonding. The semi-cured (B stage) adhesion layer 73c become the perfectly cured (C stage) adhesion layer 73.

Figure 17C:
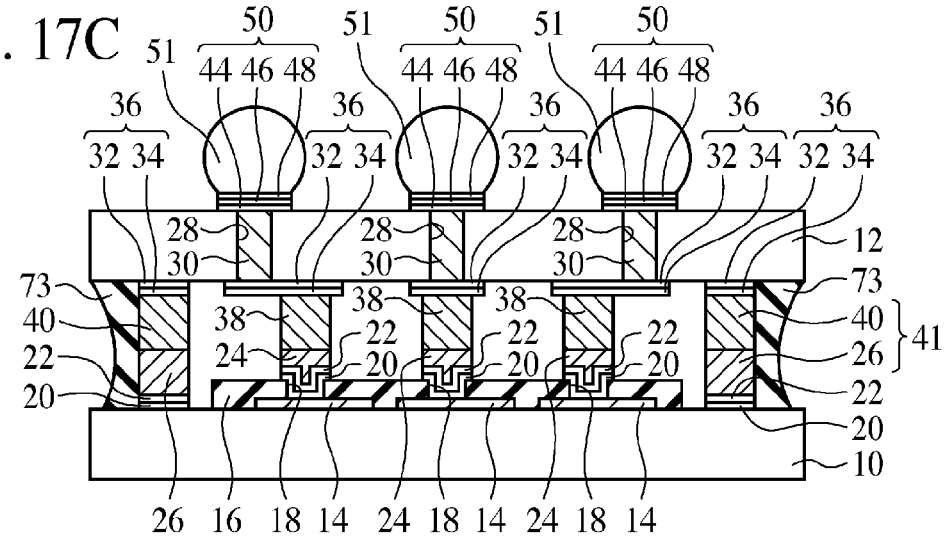

Next, the solder bumps 51 of, e.g., Sn-based solder are formed on the outside connection electrodes 50 (see FIG. 17C).

The solder bumps 51 are formed here after the sealing structure 26 and the sealing structure 40 have been bonded by the intermetallic solid phase diffusion bonding, and the electrodes 24 and the electrodes 38 have been bonded by the intermetallic solid phase diffusion bonding, but the solder bump 51 may be formed before the semiconductor substrate 10 and the sealing substrate 12 have been opposed.

Then, the semiconductor substrate 10 and the sealing substrate 12 are cut in chip sizes. This processing is unnecessary when the semiconductor substrate 10 and the sealing substrate 12 have been cut in chip sizes.

Thus, the electronic device according to the present modification is fabricated.

Thus, the adhesion layer 73b of an adhesive may be formed on the side surface of the sealing structure by applying the adhesive 73a of a photosensitive resin to the entire surface, curing the adhesive 73a and patterning the semi-cured adhesion layer 73b.

A Second Embodiment

The method for fabricating the electronic device according to a second embodiment of the present invention will be explained with reference to FIGS. 18A to 20C.

FIG. 18A to 20C are sectional views of the electronic device according to the present embodiment in the steps of the method for fabricating the electronic device, which illustrate the method.

The same members of the present embodiment as those of the electronic device according to first embodiment and the method for fabricating the electronic device illustrated in FIGS. 1 to 17C are represented by the same reference numbers not to repeat or to simplify their explanation.

The method for fabricating the electronic device according to the present embodiment is characterized in that an adhesion layer 42b is formed on the side surface of a sealing structure 40 on the side of a sealing substrate 12, and an adhesion layer 78b is formed on the side surface of a sealing structure 26 on the side of a semiconductor substrate 10; and the adhesion layer 42b on the side of the sealing substrate 12 and the adhesion layer 78b on the side of the semiconductor substrate 10 are bonded with each other.

First, the step of preparing the semiconductor substrate 10 to the step of forming electrodes 24 and the sealing structure 26 on the semiconductor substrate 10 including the electrodes 24 and the sealing structure 26 forming step are the same as those of the electronic device fabricating method described above with reference to FIGS. 2A to 3B, and their explanation will not be repeated.

Next, the adhesion layer 78b is formed on the side surface of the sealing structure 26 by printing. Specifically, the adhesion layer 78b is formed on the side surface o the sealing structure 26 as follows.

Figure 18A:
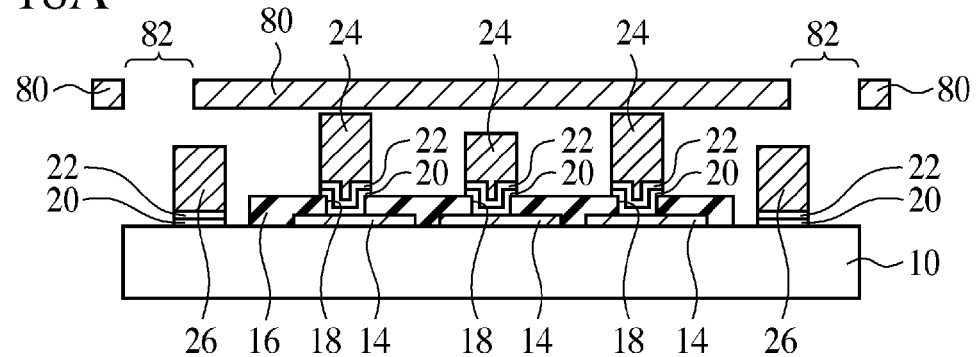
FIGS. 18A to 18C are views of the electronic device according to a second embodiment of the present invention in the steps of the method for fabricating the electronic device, which illustrate the method (Part 1).

First, as illustrated in FIG. 18A, a mask 80 with an opening 82 for exposing the side surface of the sealing structure 26 formed in is placed over the semiconductor substrate 10.

Figure 18B:
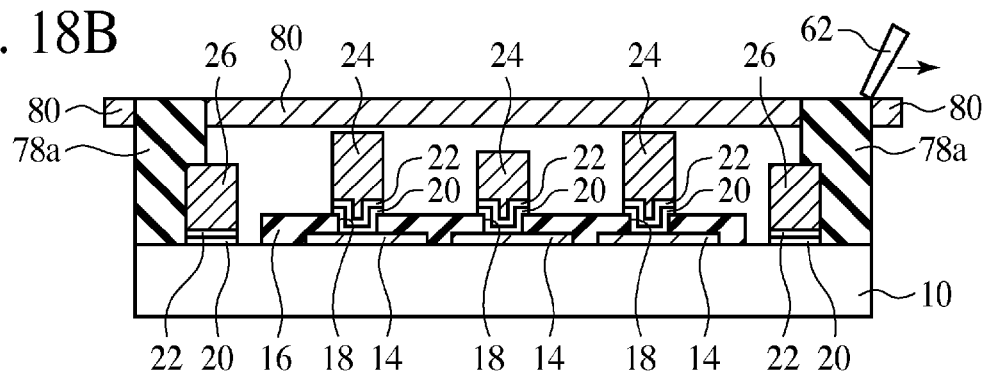

Then, as illustrated in FIG. 18B, an adhesive 78a is applied by using a mask 80 and a squeegee 62, etc. The adhesive 78a is, e.g., B stage adhesive by Ablestik Laboratories (trade name: ABLEFLEX 6200) as in the first embodiment.

As described above, the adhesive has the curing characteristics property that the adhesive is liquid (A stage) before thermal processing, becomes semi-cured (B stage) by the thermal processing of a relatively low temperature, and is perfectly cured (C stage) by thermal processing of a higher temperature.

Figure 18C:
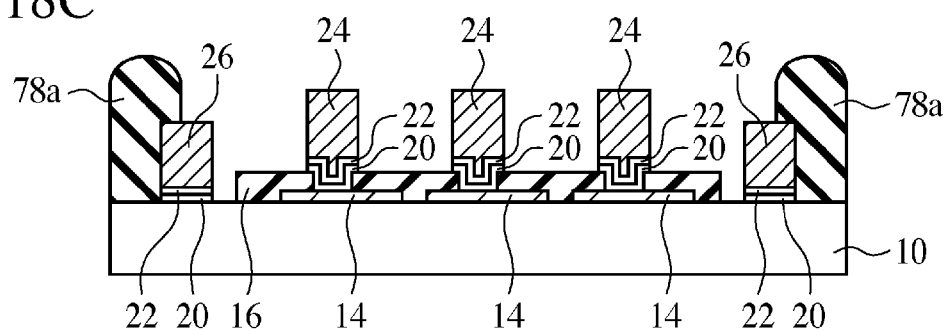

Thus, the adhesion layer 78a of the adhesive is formed on the side surface of the frame-shaped sealing structure 26 (see FIG. 18C). Immediately after the adhesion layer 78a has been applied, when the thermal processing has not yet been performed, the adhesion layer 78a is liquid (A stage). The adhesion layer 78a, however, is relatively highly viscous and pasty, and never spread excessively horizontally.

Figure 19A:
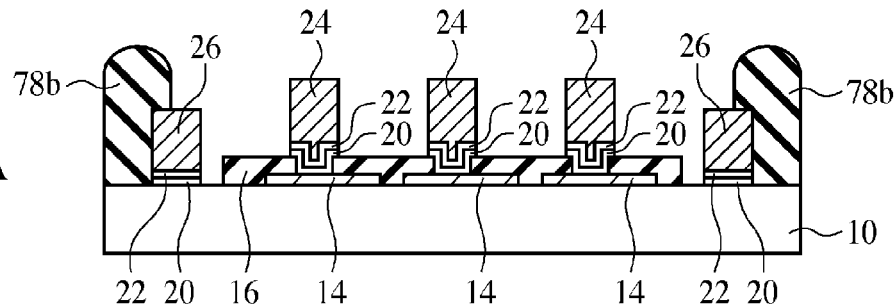
FIGS. 19A to 19C are views of the electronic device according to the second embodiment of the present invention in the steps of the method for fabricating the electronic device, which illustrate the method (Part 2).

Next, thermal processing is performed under conditions which semi-cure the adhesion layer 78a, whereby the adhesion layer 78b is semi-cured (B stage) (see FIG. 19A). The thermal processing temperature (a first temperature) is, e.g., about 100-130° C. The thermal processing period of time is, e.g., about 1 hour. The thermal processing conditions are not limited to the above and can be for semi-curing the adhesion layer 78a.

Next, the semiconductor substrate 10 is fixed to the chuck table 66 of an ultraprecise lathe 64 by vacuum suction (see FIG. 4A).

Figure 19B:
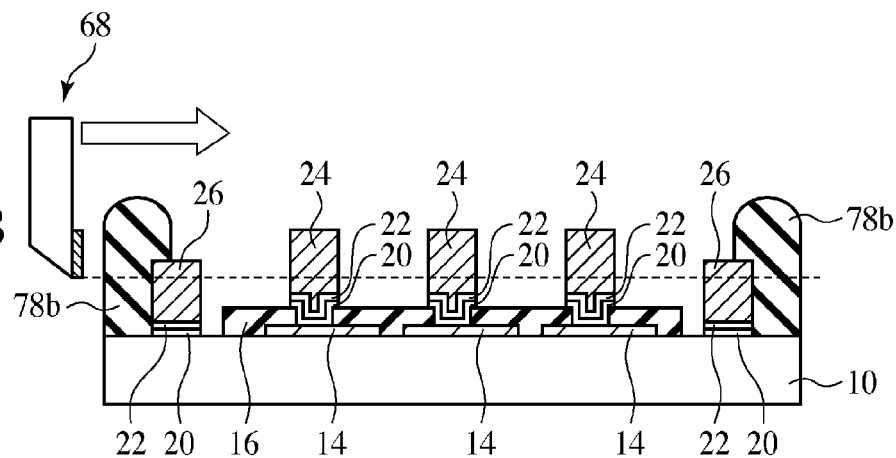

Next, with the semiconductor substrate 10 set on rotation, the upper portions of the electrodes 24, the upper portion of the sealing structure 26 and the upper portion of the adhesion layer 78b are cut with a cutting tool 68 of diamond (see FIG. 19B). At this time, the cutting is performed until the upper surfaces of the electrodes 24 (opposed to the electrodes 38 formed on the sealing substrate 12) and the upper surface of the sealing structure 26 (opposed to the sealing structure 40 formed on the sealing substrate 12) are higher by about 20 μm than one primary surface of the semiconductor substrate 10 (opposed to the sealing substrate 12). The broken lines in FIG. 19B indicate the cut face by the cutting tool 68.

Conditions for cutting the upper portions of the electrodes 24, the upper portion of the sealing structure 26 and the upper portion of the adhesion layer 78b are as exemplified below.

The rake angle of the cutting tool 68 is, e.g., 30 degrees.

The rotation number of the chuck table 66 is, e.g., about 1000 rpm.

The cut amount of the cutting tool 68 is, e.g., about 2 μm,

The feed of the cutting tool 68 is, e.g., 20 μm/rotations.

The cutting conditions are not limited to the above.

When fins are formed on the electrodes 24 in the cutting, there is a risk that the adjacent or neighboring electrodes 24 may short-circuit with each other. It is preferable to suitably set the cutting conditions so that no fins may be formed on the electrodes 24 in the cutting.

Figure 19C:
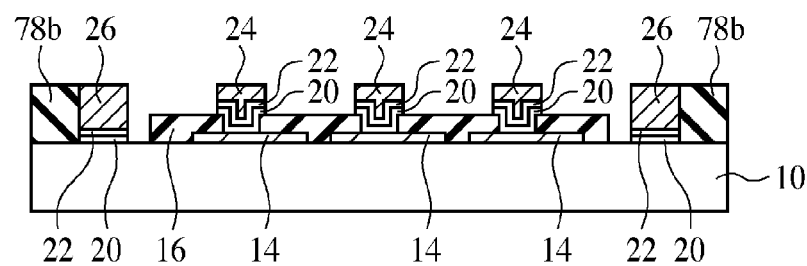

Thus, as illustrated in FIG. 19C, the upper portions of the electrodes 24, the upper portion of the sealing structure 26 and the upper portion of the adhesion layer 78b are cut. The upper portions of the electrodes 24, the upper portion of the sealing structure 26 and the upper portion of the adhesion layer 78b are cut with the cutting tool 68, whereby the upper surfaces of the electrodes 24 (opposed to the electrodes 38 formed on the sealing substrate 12), the upper surface of the sealing structure 26 (opposed to the surface of the sealing structure 40 formed on the sealing substrate 12) and the upper surface of the adhesion layer 78b (opposed to the sealing structure 12) are on the same height level.

The step of preparing the sealing substrate 12 to the step of cutting the upper portions of the electrodes 38, the upper portion of the sealing structure 40 and the upper portion of the adhesion layer 42b including the latter step are the same as those of the method for fabricating the electronic device described above with reference to FIGS. 6A to 12B, and their explanation will not be repeated.

Figure 20A:
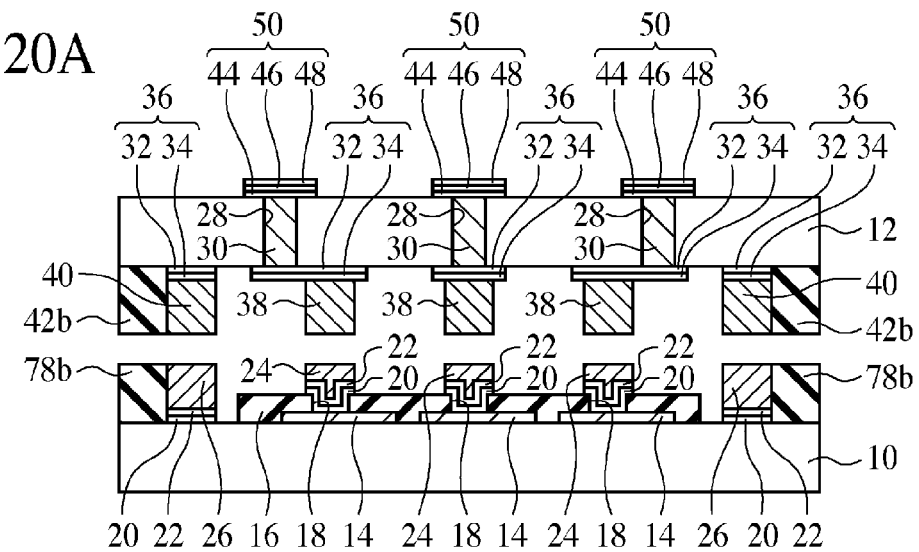
FIGS. 20A to 20C are views of the electronic device according to the second embodiment of the present invention in the steps of the method for fabricating the electronic device, which illustrate the method (Part 3).

Next, as illustrated in FIG. 20A, the semiconductor substrate 10 and the sealing substrate 12 are opposed to each other. At this time, the semiconductor substrate 10 and the sealing substrate 12 are opposed with the electrodes 24 on the side of the semiconductor substrate 10 opposed to the electrodes 38 on the side of the sealing substrate 12 and with the sealing structure 26 on the side of the semiconductor substrate 10 and the electrodes 38 on the side of the sealing substrate 12 opposed to each other.

The semiconductor substrate 10 and the sealing structure 12 may be respectively cut in chip sizes before the semiconductor substrate 10 and the sealing structure 12 are opposed to each other.

Then, the thermal processing is performed, while applying a pressure, on the semiconductor substrate 10 and the sealing substrate 12 positioned upper of the semiconductor substrate 10 with the sealing structure 26 on the side of the semiconductor substrate 10 and the sealing structure 40 on the side of the sealing substrate 12 adhered to each other and with the electrodes 24 on the side of the semiconductor substrate 10 and the electrodes 38 on the side of the sealing substrate 12 adhered to each other. At this time, the thermal processing is performed under conditions which do not melt the semi-cured adhesion layer 78b and the electrodes 38, 24 and the sealing structures 26, 40.

To melt the semi-cured adhesion layer 78b at the first temperature, the thermal processing must be performed at a thermal processing temperature (a second temperature) higher than the first temperature. The thermal processing temperature (the second temperature) is, e.g., about 170° C. The thermal processing period of time is, e.g., 5-10 seconds.

The melted adhesion layers 42b, 78b are connected to each other.

After the thermal processing, the adhesion layers 42b, 78b are cured to be semi-cured (B stage).

However, the thermal processing, which is performed at a higher thermal processing temperature (the second temperature) higher than the thermal processing temperature (the first temperature) at which the liquid adhesion layers 42a, 78a have been made the semi-cured adhesion layers 42b, 78b, are further cured. The adhesion layers 42c, 78c again cured after the thermal processing of the second temperature never melt unless the thermal processing is performed at a temperature sufficiently higher than the second temperature. Thus, an adhesion layer 84 of the adhesion layer 42c and the adhesion layer 78c is formed.

Figure 20B:
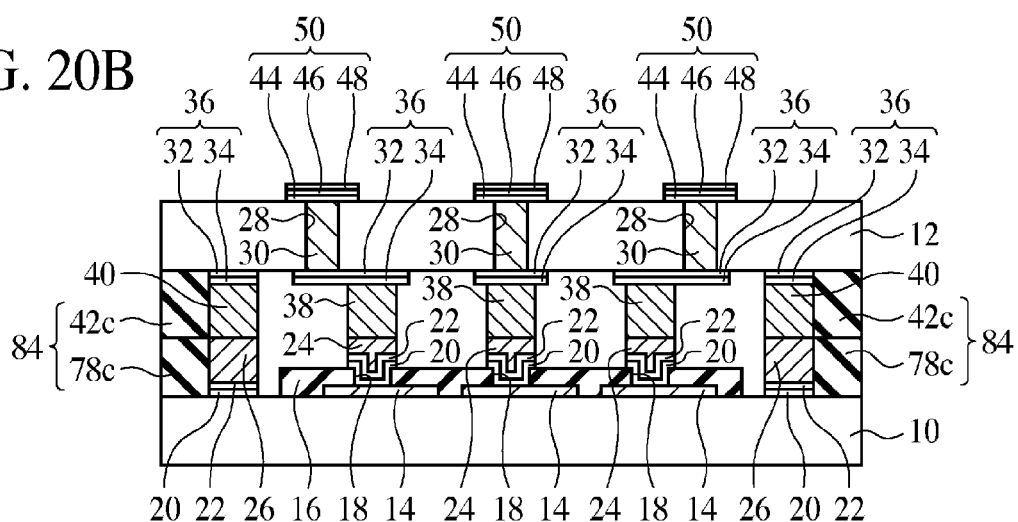

The adhesion layer 84 formed on the side surface of the sealing structure 26 on the side of the semiconductor substrate 10 and on the side surface of the sealing structure 40 on the side of the sealing substrate 12 ensures the adhesion between the sealing structure 26 on the semiconductor substrate 10 and the sealing structure 40 on the sealing substrate 12 and also ensures the adhesion between the electrodes 24 on the side of the semiconductor substrate 10 and the electrodes 38 on the side of the sealing substrate 12 (see FIG. 20B).

Next, thermal processing is performed with, e.g., an oven under conditions which integrate the electrodes 24 and the electrodes 38 with each other by the intermetallic solid phase diffusion bonding and integrate the sealing structure 26 and the sealing structure 40 with each other by the intermetallic solid phase diffusion bonding.

At this time, the adhesion between the sealing structure 26 on the side of the semiconductor substrate 10 and the sealing structure 40 on the side of the sealing substrate 12, and the adhesion between the electrodes 24 on the side of the semiconductor substrate 10 and the electrodes 38 on the side of the sealing substrate 12 must be ensured by the adhesion layer 84.

To this end, the thermal processing is performed at a thermal processing temperature (a third temperature) which does not melt the semi-cured adhesion layer 84. Specifically, the thermal processing is performed at a thermal processing temperature (the third temperature) which is not much higher than the thermal processing temperature (the second temperature) at which the adhesion layers 42b, 78b have been melted, whereby the melt of the adhesion layer 84 is prevented while the intermetallic solid phase diffusion bonding can be advanced.

The thermal processing temperature (the third temperature) is, e.g., 150° C. The thermal processing period of time is, e.g., 1 hour.

This thermal processing integrates the sealing structure 26 on the side of the semiconductor substrate 10 and the sealing structure 40 on the side of the sealing substrate 12 with each other by the intermetallic solid phase diffusion bonding, and the electrodes 24 on the side of the semiconductor substrate 10 and the electrodes 38 on the side of the sealing substrate 12 with each other by the intermetallic solid phase diffusion bonding. Also, the semi-cured (B stage) adhesion layers 42c, 78c become the perfectly cured (C stage) adhesion layers 42, 78. The perfectly cured adhesion layer 42 and the perfectly cured adhesion layer 78 form the adhesion layer 84a.

Figure 20C:
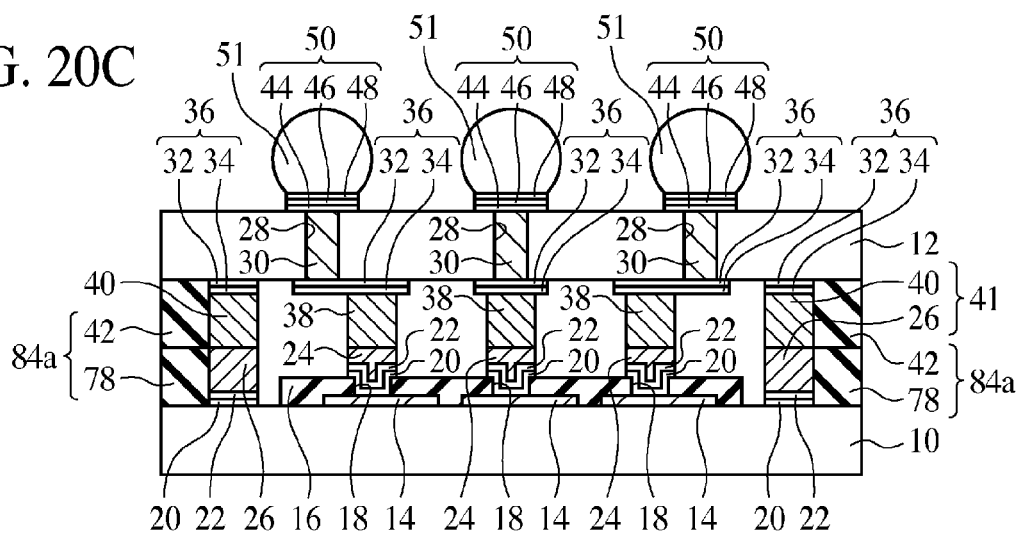

Next, solder bumps 51 of, e.g., Sn-based solder are formed on outside connection electrodes 50 (see FIG. 20C). The solder bumps 51 are formed here after the sealing structure 26 and the sealing structure 40 have been bonded by the intermetallic solid phase diffusion bonding, and the electrodes 24 and the electrodes 38 have been bonded by the intermetallic solid phase diffusion bonding but may be formed before the semiconductor substrate 10 and the sealing substrate 12 have been opposed.

Then, the semiconductor substrate 10 and the sealing substrate 12 are cut in chip sizes. This processing is unnecessary when the semiconductor substrate 10 and the sealing substrate 12 have been cut in chip sizes.

Thus, the electronic device according to the present modification is fabricated.

As described above, the method for fabricating the electronic device according to the present embodiment is characterized in that the adhesion layer 42b is formed on the side surface of the sealing structure 40 on the side of the sealing substrate 12 and also the adhesion layer 78b is formed on the side surface of the sealing structure 26 on the side of the semiconductor substrate 10, and the adhesion layer 42b on the side of the sealing substrate 12 and the adhesion layer 78b on the side of the semiconductor substrate 10 are connected to each other.

According to the present embodiment, the adhesion layer 42b is formed on the side surface of the sealing structure 40 on the side of the sealing substrate 12 and also on the side surface of the sealing structure 26 on the side of the semiconductor substrate 10, and the adhesion layer 42b on the side of the sealing substrate 12 and the adhesion layer 78b on the side of the semiconductor substrate 10 are connected to each other, which makes it unnecessary to flow the adhesion layer 42b to the semiconductor substrate 10 as in the fabrication method according to the first embodiment.

According to the present embodiment, the adhesion layer 42b on the side of the sealing substrate 12 and the adhesion layer 78b on the side of the semiconductor substrate 10 can be thus connected to each other in a short period of time.

According to the present embodiment, it is unnecessary to flow the adhesion layer 42b formed on the side of the sealing substrate 12 to the semiconductor substrate 10 as in the fabrication method according to the first embodiment, and accordingly, the thermal processing of high temperature which makes the viscosity of the adhesion layer 42b sufficiently low unnecessary.

According to the present embodiment, the adhesion layer 42b on the side of the sealing substrate 12 and the adhesion layer 78c on the side of the semiconductor substrate 10 can be connected to each other even at the relatively low thermal processing temperature, which can prevent the melt of the electrodes 24, 38 or the sealing structures 26, 40 in forming the adhesion layer 84.

A Third Embodiment

The method for fabricating the electronic device according to a third embodiment of the present invention will be explained with reference to FIGS. 21A to 23C. FIGS. 21A to 23C are sectional views of the electronic device according to the present embodiment in the steps of the method for fabricating the electronic device, which illustrate the method.

The same members of the present embodiment as those of the electronic device according to the first or the second embodiment and the method for fabricating the electronic device illustrated in FIGS. 1 to 20C are represented by the same reference numbers not to repeat or to simplify their explanation.

The method for fabricating the electronic device according to the present embodiment is characterized in that no adhesion layer is formed on the side of a sealing substrate 12, and an adhesion layer is formed only on the side of a semiconductor substrate 10.

First, the step of preparing the semiconductor substrate 10 to the step of forming electrodes 24 and a sealing structure 26 on the semiconductor substrate 10 including the latter step are the same as those of the method for fabricating the electronic device according to the first embodiment illustrated in FIGS. 2A to 3B, and their explanation will not be repeated.

The step of forming the adhesion layer 78b on the side surface of the sealing structure 26 to the step of cutting the upper portions of the electrodes 24, the upper portion of the sealing structure 26 and the upper portion of the adhesion layer 78b including the latter step are the same as those of the method for fabricating the electronic device according to the second embodiment illustrated in FIGS. 18A to 19C, and their explanation will not be repeated.

The step of preparing the sealing structure 12 to the step of forming the electrodes 38 and the sealing structure 40 on the sealing substrate 12 including the latter step are the same as those of the method for fabricating the electronic device according to the first embodiment illustrated in FIGS. 6A to 8B, and their explanation will not be repeated.

Figure 21A:
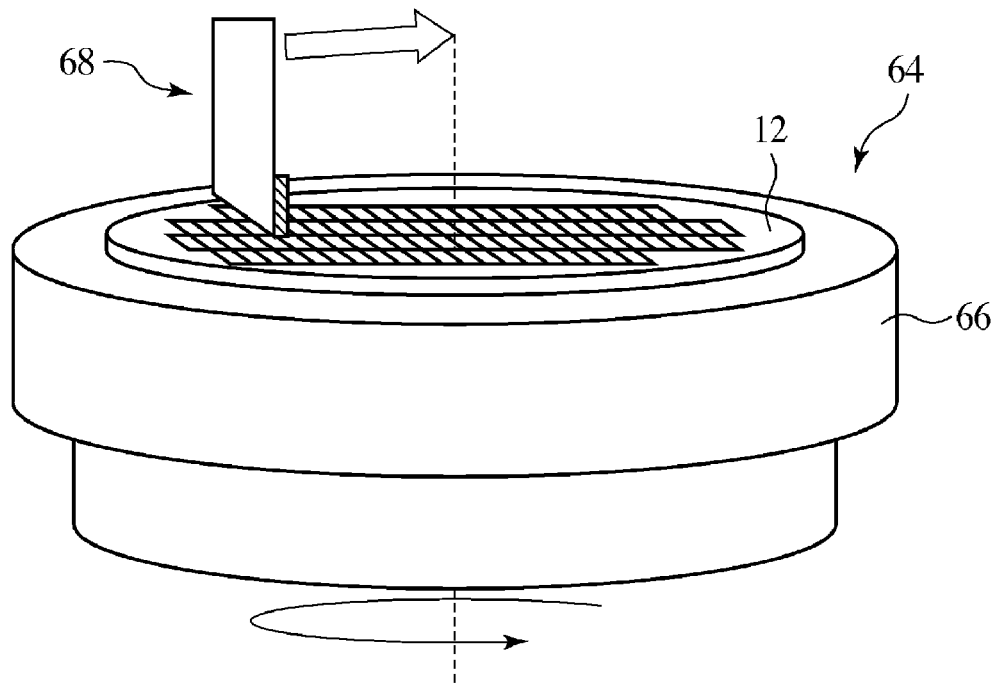
FIGS. 21A and 21B are views of the electronic device according to a third embodiment of the present invention in the steps of the method for fabricating the electronic device, which illustrate the method (Part 1).

Then, the sealing substrate 12 without an adhesion layer formed on the sealing substrate 12 is fixed to the chuck table 66 of an ultraprecise lathe 66 by vacuum suction. FIG. 21A is a perspective view of the sealing substrate fixed to the ultraprecise lathe.

Figure 21B:
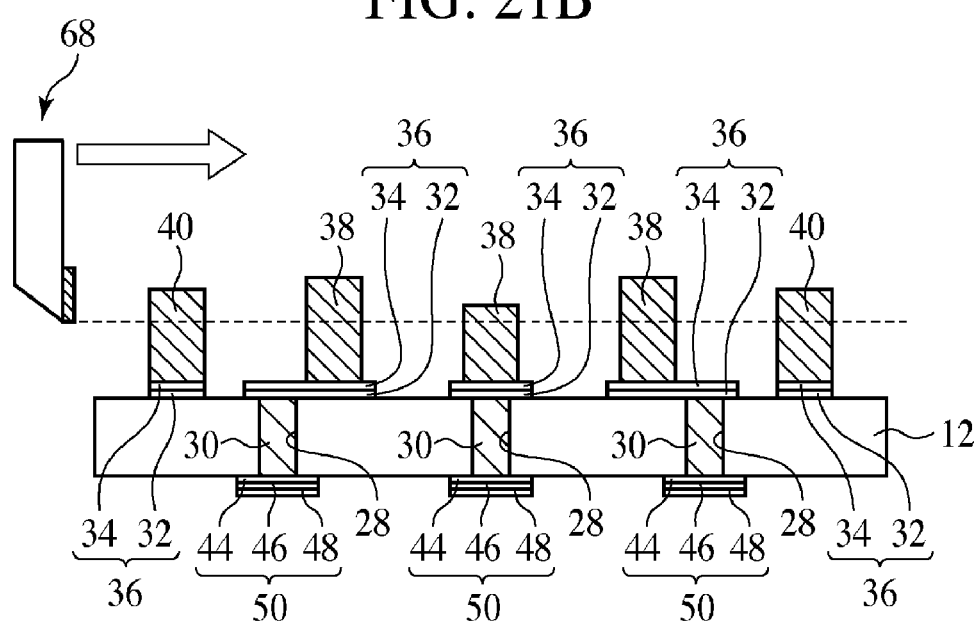

While the sealing substrate 12 is set on rotation, the upper portions of the electrodes 38 and the upper portion of the sealing structure 40 are cut with a cutting tool 68 of diamond (see FIGS. 21A and 21B).

At this time, the cut is performed until the upper surfaces of the electrodes 38 (opposed to the electrodes 24 formed on the semiconductor substrate 10) and the upper surface of the sealing structure 40 (opposed to the sealing structure 26 formed on the semiconductor substrate 10) are higher by about 20 μm than one primary surface of the sealing substrate 12 (opposed to the semiconductor substrate 10). The broken line in FIG. 21B indicate the cut surface with the cutting tool 68.

Conditions for cutting the upper portions of the electrodes 38 and the upper portion of the sealing structure 40 are exemplified below.

The rake angle of the cutting tool 68 is, e.g., 30 degrees. The rotation number of the chuck table 66 is, e.g., about 1000 rpm. The cut amount of the cutting tool 68 is, e.g., about 2 μm. The feed of the cutting tool 68 is, e.g., 20 μm/rotations.

Preferably, conditions for the cut are suitably set so that no fins are formed in the electrodes 38 in the cut, because when fins are formed in the electrodes 38 in the cut, there is a risk that the fins may short-circuit the adjacent or neighboring electrodes 38.

Thus, the upper portions of the electrodes 38 and the upper portion of the sealing structure 40 are cut. The upper portions of the electrodes 38 and the upper portion of the sealing structure 40 are cut with the cutting tool 68, which makes the upper surfaces of the electrodes 38 (opposed to the electrodes 24 formed on the semiconductor substrate 10) and the upper surface of the sealing structure 40 (opposed to the sealing structure 26 formed on the semiconductor substrate 10) are on the same height level (see FIG. 22A).

Figure 22A:
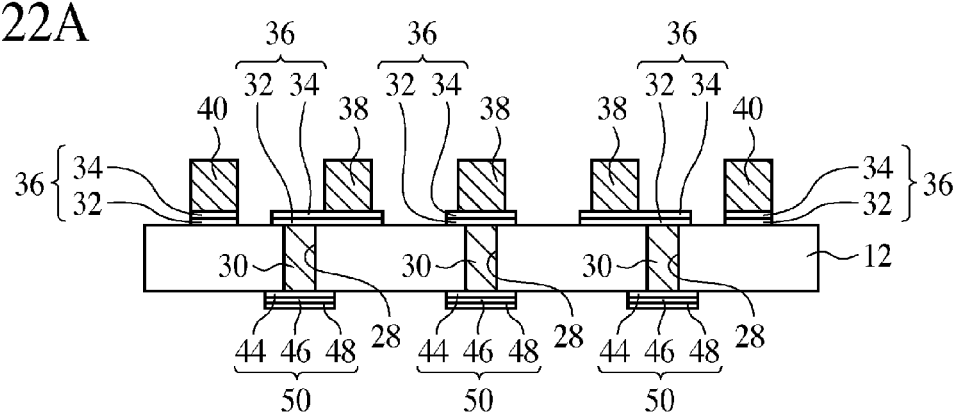
FIGS. 22A and 22B are views of the electronic device according to the third embodiment of the present invention in the steps of the method for fabricating the electronic device, which illustrate the method (Part 2).
Figure 22B:
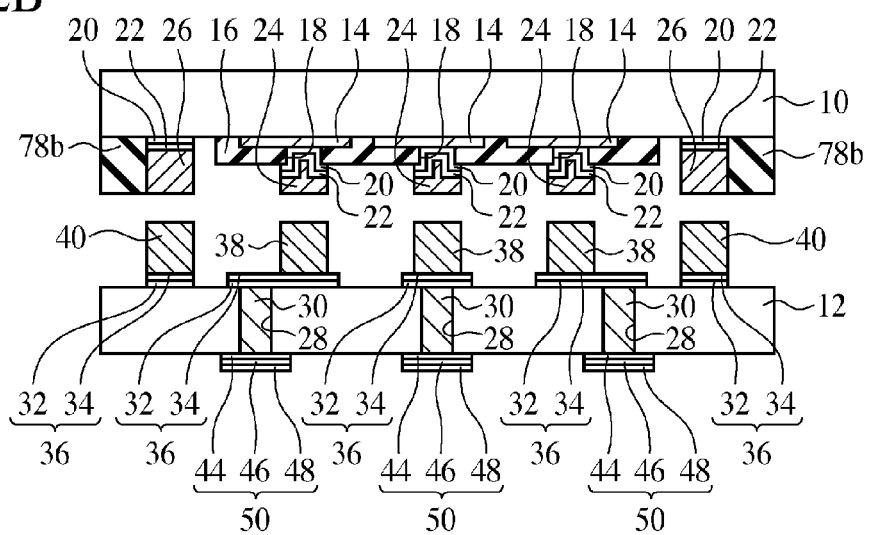

Next, as illustrated in FIG. 22B, the semiconductor substrate 10 and the sealing substrate 12 are opposed to each other. At this time, the semiconductor substrate 10 and the sealing substrate 12 are opposed to each other with the electrodes 24 on the side of the semiconductor substrate 10 and the electrodes 38 on the side of the sealing structure 12 opposed to each other and with the sealing structure 26 on the side of the semiconductor substrate 10 and the electrodes 38 on the side of the sealing substrate 12 opposed to each other.

Before the semiconductor substrate 10 and the sealing structure 12 are opposed to each other, the semiconductor substrate 10 and the sealing substrate 12 may be respectively cut in chip sized to be opposed to each other in the chip sizes.

Then, the thermal processing is performed, while applying a pressure, on the semiconductor substrate 10 and the sealing substrate 12 positioned upper of the semiconductor substrate 10 with the sealing structure 26 on the side of the semiconductor substrate 10 and the sealing structure 40 on the side of the sealing substrate 12 adhered to each other and with the electrodes 24 on the side of the semiconductor substrate 10 and the electrodes 38 on the side of the sealing substrate 12 adhered to each other.

At this time, the thermal processing is performed under conditions which melt the semi-cured adhesion layer 78 but do not melt the electrodes 38, 24 and the sealing structures 26, 40.

To melt the adhesion layer 78b semi-cured at the first temperature, it is necessary to perform the thermal processing at a thermal processing temperature (a second temperature) which is higher than the first temperature. The thermal processing temperature (the second temperature) is, e.g., about 170° C. The thermal processing period of time is, e.g., 5-10 seconds.

The melted adhesion layer 78b arrives at the side surface of the sealing structure 40 on the side of the sealing substrate 12. Accordingly, the adhesion layer 78c is formed on the side surface of the sealing structure 26 on the semiconductor substrate 10 and on the side surface of the sealing structure 40 on the sealing substrate 12. After the thermal processing, the adhesion layer 78b cures to semi-cured (B stage). However, the thermal processing is performed at the thermal processing temperature (the second temperature) higher than the thermal processing temperature (the first temperature), at which the liquid adhesion layer 78a has been semi-cured to be the adhesion layer 78b, whereby the adhesion layer 78c again cured is further cured.

The adhesion layer 78c which has be again cured after the thermal processing at the second temperature never again melt unless the thermal processing is performed at a temperature sufficiently higher than the second temperature.

Thus, the adhesion layer 78c is formed on the side surface of the sealing structure 26 on the side of the semiconductor substrate 10 and on the side surface of the sealing structure 40 on the side of the sealing substrate 12, whereby the adhesion between the sealing structure 26 on the side of the semiconductor substrate 10 and the sealing structure 40 on the side of the sealing substrate 12 can be ensured by the adhesion layer 78c. The adhesion between the electrodes 24 on the side of the semiconductor substrate 10 and the electrodes 38 on the side of the sealing substrate 12 is also ensured by the adhesion layer 78c (see FIG. 23A).

Then, thermal processing is performed with, e.g., an oven (thermal processing apparatus) under conditions which integrate the electrodes 24 and the electrodes 38 with each other by the intermetallic solid phase diffusion bonding and integrate the sealing structure 26 and the sealing structure 40 with each other by the intermetallic solid phase diffusion bonding.

At this time, the adhesion between the sealing structure 26 on the side of the semiconductor substrate 10 and the sealing structure 40 on the side of the sealing substrate 12, and the adhesion between the electrodes 24 on the side of the semiconductor substrate 10 and the electrodes 38 on the side of the sealing substrate 12 must be ensured by the adhesion layer 78c. To this end, the thermal processing is performed at a thermal processing temperature (a third temperature) which does not melt the semi-cured adhesion layer 78c.

To be specific, the thermal processing is performed at a thermal processing temperature (the third temperature) which is not much higher than the thermal processing temperature (the second temperature), at which the adhesion layer 78b has been melted, whereby the melt of the adhesion layer 78c can be prevented while the intermetallic solid phase diffusion bonding can be advanced. The thermal processing temperature (the third temperature) is, e.g., 170° C. The thermal processing period of time is, e.g., 1 hour.

This thermal processing integrates the sealing structure 26 on the side of the semiconductor substrate 10 and the sealing structure 40 on the side of the sealing substrate 12 with each other and integrates the electrodes 24 on the side of the semiconductor substrate 10 and the electrodes 38 on the side of the sealing structure 12 with each other by the intermetallic solid phase diffusion bonding. On the other hand, the semi-cured (B stage) the adhesion layer 78c becomes the perfectly cured (C stage) adhesion layer 78 (see FIG. 23B).

Figure 23A:
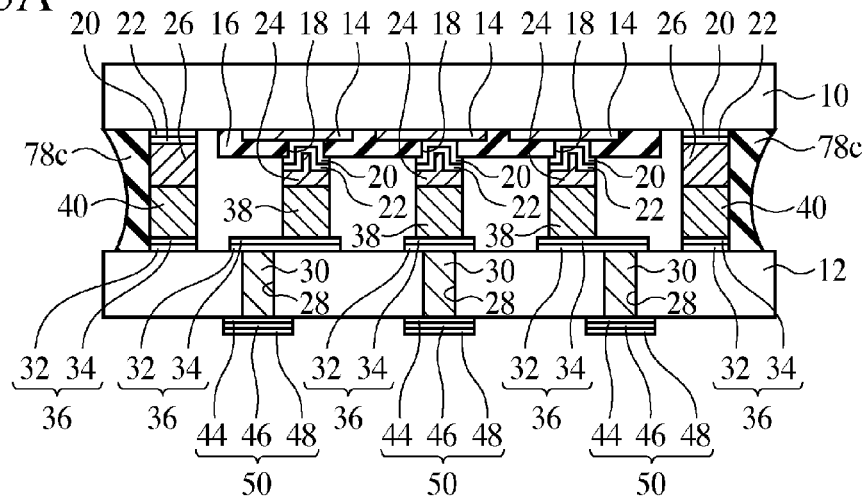
FIGS. 23A to 23C are views of the electronic device according to the third embodiment of the present invention in the steps of the method for fabricating the electronic device, which illustrate the method (Part 3).
Figure 23B:
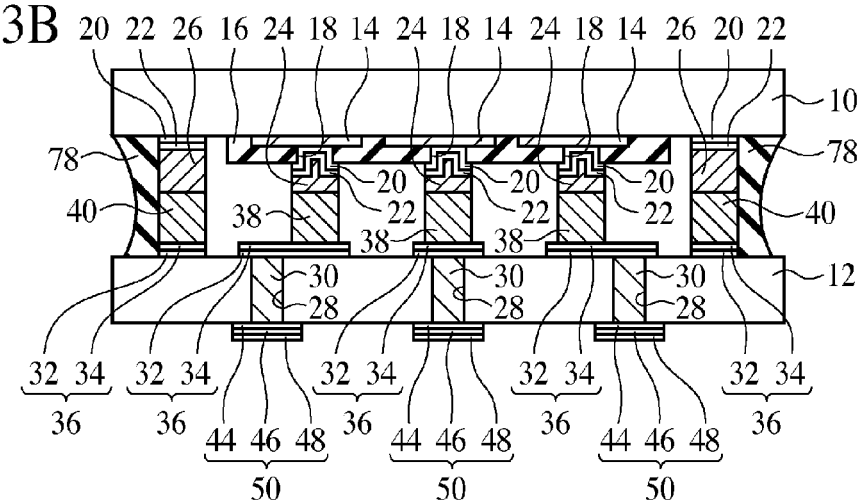
Figure 23C:
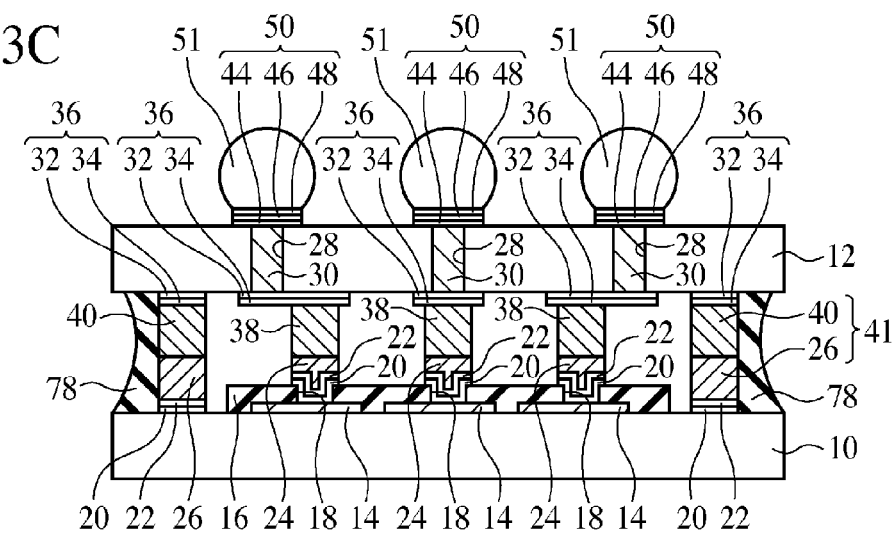

Next, on the outside connection electrodes 50, solder bumps 51 of, e.g., Sn-based solder are formed (see FIG. 23C). The solder bumps 51 are formed here after the sealing structure 26 and the sealing structure 40 have been bonded by the intermetallic solid phase diffusion bonding, and the electrodes 24 and the electrodes 38 have been bonded by the intermetallic solid phase diffusion bonding but may be formed before the semiconductor substrate 10 and the sealing substrate 12 have been opposed.

Then, the semiconductor substrate 10 and the sealing substrate 12 are cut in chip sizes. This processing is unnecessary when the semiconductor substrate 10 and the sealing substrate 12 have been cut in chip sizes.

Thus, the electronic device according to the present modification is fabricated.

As described above, without forming an adhesion layer on the side surface of the sealing structure 40 on the side of the sealing substrate 12, the adhesion layer 78b is formed only on the side surface of the sealing structure 26 on the side of the semiconductor substrate 10, and then the thermal processing is may be performed to thereby cause the adhesion layer 78c arrive at the side surface of the sealing structure 40.

Modified Embodiments

The present invention is not limited to the above-described embodiments and can cover other various modifications.

In the second and the third embodiments, the adhesion layers are formed by printing. However, as in the method for fabricating the electronic device according to the modification of the first embodiment, a photosensitive adhesive is applied to the entire surface, cause the adhesive semi-cured, and the semi-cured adhesive may be patterned to thereby form the adhesion layer of the adhesive.

In the above-described embodiments, concurrently with cutting the upper portions of the sealing structures, the upper portions of the adhesion layers are cut, but the upper portions of the adhesion layers may not be cut when the upper portions of the sealing structures are cut. For example, the adhesion layer may be formed on the side surfaces of the sealing structures. In this case, it is preferable that the adhesion layers do not adhere to one surface of the sealing structure (opposed to the other sealing structure). It is possible that the adhesion layers may be formed in a height lower than the sealing structures, and then the upper portions of the sealing structures are cut. In this case, the sealing structures alone are cut.

In the above-describe embodiments, the adhesion layers are formed outer of the sealing structures. However, the adhesion layers may be formed inner of the sealing structures. The adhesion layers may be formed outer and inner of the sealing structures.

In the above-described embodiments, the sealing structures are formed in a frame-shaped plane shape. However, the plane shape of the sealing structures is not essentially the frame-shape. The sealing structure may be formed in, e.g., a ring-shape enclosing a predetermined region on the semiconductor substrate 10 where a electronic circuit element is formed.

In the above-described embodiments, the electrodes 24 on the side of the semiconductor substrate 10 and the sealing structure 26 on the side of the sealing substrate 12 are formed of Au. However, the electrodes 24 and the sealing structure 26 on the sealing substrate 12 are not essentially formed of Au. For example, the electrodes 24 and the sealing structure 26 on the side of the sealing substrate 12 may be formed of an Au alloy, Sn, an Sn alloy or others.

In the above-described embodiments, the electrodes 38 and the sealing structure 40 on the side of the semiconductor substrate 10 are formed of an Sn alloy (Sn-based solder). However, the electrodes 38 and the sealing structure 40 on the side of the semiconductor substrate 10 are not essentially formed of an Sn alloy and can be formed of, e.g., Sn, Au, an Au alloy or others.

In the above-described embodiments, the electrodes 24 and the sealing structure 26 on the side of the semiconductor substrate 10 are formed of the same material but may be formed of different materials from each other.

In the above-described embodiments, the electrodes 38 and the sealing structure 40 on the side of the sealing substrate 12 are formed of the same material but may be formed of materials different from each other.

In the above-described embodiments, the electrodes 24 and the sealing structure 40 on the side of the sealing substrate 12, and the electrodes 24 and the sealing structure 26 on the side of the semiconductor substrate 10 are formed of materials different from each other but may be formed of the same material.

In the above-described embodiments, the sealing structures 26, 40 are formed of metal but are not essentially formed of metal. The sealing structures 26, 40 may be formed of, e.g., ceramics or others.

In the above-described embodiments, the adhesive is an epoxy resin-based adhesive but is not essentially an epoxy resin-based adhesive.

For example, a BCB (benzocyclobutene) resin-based adhesive may be used.

Such BCB adhesive can be, e.g., an adhesive by the Dow Chemical Company (type: CYCLOTENE 3022-63) or others. For such adhesive, the thermal processing conditions for the semi-cure (B stage) are 180° C. and about 1 hour, and the thermal processing conditions for the perfect cure (C stage) are 250° C. and about 1 hours.

In the above-described embodiments, one substrate 10 is a semiconductor substrate but is not essentially a semiconductor substrate.

That is, the present invention is applicable to fabricating an SAW (Surface Acoustic Wave) device including comb electrodes formed on, e.g., an LiTaO$_3$ substrate as one substrate 10.

That is, the present invention is not limited to the semiconductor device described above and is applicable to fabricating electronic apparatuses by sealing various electronic circuit elements formed on substrates.

What is claimed is:

1. A method for fabricating an electronic device comprising the steps of:
    forming a first sealing structure on one primary surface of a first substrate, enclosing a predetermined region of said one primary surface of the first substrate, where an electronic circuit element is formed;
    cutting the upper portion of the first sealing structure with a cutting tool;
    forming a second sealing structure on a second substrate, corresponding to the first sealing structure;
    cutting the upper portion of the second sealing structure with a cutting tool;
    forming a semi-cured adhesion layer on the side surface of one of the first sealing structure and the second sealing structure;
    causing the first sealing structure and the second sealing structure adhered with each other, and performing thermal processing with said one of the first sealing structure and the second sealing structure positioned upper of the other of the first sealing structure and the second sealing structure so as to melt the adhesion layer and cause the adhesion layer to arrive at the side surface of said other of the first sealing structure and the second sealing structure; and
    performing thermal processing after the adhesion layer has been cured to bond the first sealing structure and the second sealing structure by solid phase diffusion bonding.

2. A method for fabricating an electronic device according to claim 1, wherein
    in the step of forming the semi-cured adhesion layer, the semi-cured adhesion layer is formed on the side surface of the second sealing structure, and
    in the step of causing the adhesion layer to arrive at the side surface of said other of the first sealing structure and the second sealing structure, the thermal processing is performed with the second sealing structure positioned upper of the first sealing structure so as to melt the adhesion layer and cause the adhesion layer to arrive at the side surface of the first sealing structure.

3. A method for fabricating an electronic device according to claim 2, wherein
    in the step of forming a first sealing structure, a first electrode electrically connected to the electronic circuit element is further formed in the predetermined region of the first substrate;
    in the step of cutting the upper surface of the first sealing structure with the cutting tool, the upper portion of the first electrode is also cut with the cutting tool;
    in the step of forming a second sealing structure, a second electrode is further formed on the second substrate corresponding to the first electrode;
    in the step of cutting the upper portion of the second sealing structure with the cutting tool, the upper portion of the second electrodes is also cut with the cutting tool.

4. A method for fabricating an electronic device according to claim 2, wherein
    the step of forming the semi-cured adhesion layer includes a step of forming the adhesion layer on the side surface of the second sealing structure by printing; and a step of semi-curing the adhesion layer by thermal processing.

5. A method for fabricating an electronic device according to claim 2, wherein
    the step of forming the semi-cured adhesion layer including a step of applying a photosensitive adhesive on the second substrate; a step of semi-curing the adhesive by thermal processing; and a step of patterning the adhesive to form the adhesion layer of the adhesive on the side surface of the second sealing structure.

6. A method for fabricating an electronic device according to claim 1, wherein
    in the step of forming the semi-cured adhesion layer, the semi-cured adhesion layer is formed on the side surface of the first sealing structure, and
    in the step of causing the adhesion layer to arrive at the side surface of said other of the first sealing structure and the second sealing structure, thermal processing is performed with the first sealing structure positioned upper of the second sealing structure so as to melt the adhesion layer to cause the adhesion layer to arrive at the side surface of the second sealing structure.

7. A method for fabricating an electronic device according to claim 6, wherein
    in the step of forming a first sealing structure, a first electrode electrically connected to the electronic circuit element is further formed in the predetermined region of the first substrate,
    in the step of cutting the upper portion of the first sealing structure with the cutting tool, the upper portion of the first electrode is cut with the cutting tool, in the step of forming a second sealing structure, a second electrode is further formed on the second substrate, corresponding to the first electrode, and in the step of cutting the upper portion of the second sealing structure with the cutting tool, the upper portion of the second electrode is also cut with the cutting tool.

8. A method for fabricating an electronic device according to claim 6, the step of forming a semi-cured adhesion layer includes the step of forming the adhesion layer of the side surface of the first sealing structure by printing; and the step of semi-curing the adhesion layer by thermal processing.

9. A method for fabricating an electronic device according to claim 6, wherein the step of forming a semi-cured adhesion layer includes the step of applying a photosensitive adhesive on the first substrate; the step of semi-curing the adhesive by thermal processing; and patterning the adhesive to form the adhesion layer of the adhesive on the side surface of the first sealing structure.

10. A method for fabricating an electronic device according to claim 1, wherein the adhesion layer is formed of a thermosetting resin.

11. A method for fabricating an electronic device comprising the steps of:

forming a first sealing structure on one primary surface of a first substrate, enclosing a predetermined region of said one primary surface of the first substrate where an electronic circuit element is formed;

forming a first semi-cured adhesion layer on the side surface of the first sealing structure;

cutting the upper surface of the first sealing structure with a cutting tool;

forming a second sealing structure on a second substrate, corresponding to the first sealing structure;

forming a second semi-cured adhesion layer on the side surface of the second sealing structure;

cutting the upper surface of the second sealing structure with the cutting tool;

causing the first sealing structure and the second sealing structure adhered with each other, and performing thermal processing to adhere the first adhesion layer and the second adhesion layer to each other; and performing thermal processing further after the first adhesion layer and the second adhesion layer have cured so as to bond the first sealing structure and the second sealing structure to each other by solid phase diffusion bonding.

12. A method for fabricating an electronic device according to claim 11, wherein in the step of forming a first sealing structure, a first electrode electrically connected to the electronic circuit element is further formed in the predetermined region of the first substrate;

in the step of cutting the upper portion of the first sealing structure with the cutting tool, the upper portion of the first electrode is also cut with the cutting tool;

in the step of forming a second sealing structure, a second electrode is further formed on the second substrate, corresponding to the first electrode; and in the step of cutting the upper portion of the second sealing structure with the cutting tool, the upper surface of the second electrode is also cut with the cutting tool.

13. A method for fabricating an electronic device according to claim 11, wherein in the step of cutting the upper portion of the first sealing structure with the cutting tool, the upper portion of the first adhesion layer is also cut with the cutting tool, and in the step of cutting the upper portion of the second sealing structure with the cutting tool, the upper portion of the second adhesion layer is also cut with the cutting tool.

14. A method for fabricating an electronic device according to claim 11, wherein the first adhesion layer or the second adhesion layer is formed of a thermosetting resin.

\* \* \* \* \*